US012672407B2

(12) United States Patent
So et al.

(10) Patent No.: US 12,672,407 B2
(45) Date of Patent: Jun. 30, 2026

(54) MANUFACTURING METHOD FOR DISPLAY DEVICE, PANEL INCLUDING LIGHT EMITTING PANELS FOR MANUFACTURING DISPLAY DEVICE, AND DISPLAY DEVICE

(71) Applicant: Samsung Display Co., LTD., Yongin-si (KR)

(72) Inventors: Myeong Su So, Yongin-si (KR); Myeong Hee Kim, Yongin-si (KR); Ji Eun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 586 days.

(21) Appl. No.: 18/155,583

(22) Filed: Jan. 17, 2023

(65) Prior Publication Data

US 2023/0231097 A1　　Jul. 20, 2023

(30) Foreign Application Priority Data

Jan. 18, 2022　(KR) ........................ 10-2022-0007305

(51) Int. Cl.
　　*H10H 20/857*　　(2025.01)
　　*H10W 90/00*　　(2026.01)
　　*H10H 20/01*　　(2025.01)

(52) U.S. Cl.
　　CPC .......... *H10H 20/857* (2025.01); *H10W 90/00* (2026.01); *H10H 20/0364* (2025.01)

(58) Field of Classification Search
None
See application file for complete search history.

(56) References Cited

U.S. PATENT DOCUMENTS

| | | | |
|---|---|---|---|
| 10,461,123 B2 | 10/2019 | Kim et al. | |
| 11,374,083 B2 | 6/2022 | Cheng | |
| 11,423,827 B2 | 8/2022 | Kim et al. | |
| 2020/0005703 A1 | 1/2020 | Kim et al. | |
| 2020/0083200 A1 | 3/2020 | Yip | |
| 2021/0134772 A1* | 5/2021 | Jung | ...................... H10W 90/00 |
| 2022/0376150 A1* | 11/2022 | Wang | ...................... H10H 20/01 |

FOREIGN PATENT DOCUMENTS

| | | |
|---|---|---|
| JP | 2021-526658 A | 10/2021 |
| KR | 10-2018-0072909 A | 7/2018 |
| KR | 10-2020-0001657 A | 1/2020 |

* cited by examiner

*Primary Examiner* — Nilufa Rahim
(74) *Attorney, Agent, or Firm* — Womble Bond Dickinson (US) LLP

(57) ABSTRACT
A method for manufacturing a display device is provided. The method includes: placing a light emitting element on a substrate including cell areas; placing an insulating layer on the light emitting element; and separating the cell areas from each other. Light emitting panels are located on the substrate, correspond to each of the cell areas, and include the light emitting element. The separating of the cell areas from each other includes electrically separating the light emitting panels from each other. The electrically separating the light emitting panels from each other is performed after the placing of the insulating layer.

19 Claims, 26 Drawing Sheets

INS1

SUB/PCL

INP1 ELT1 ELT2 INP2

BNK

INS1

SUB/PCL

INP1 ELT1 ELT2 INP2

INS2    LD

CNE1

BNK

CNE2

INS1

SUB/PCL

INP1    ELT1    ELT2    INP2

I    I'

DR3

DR1 ⊙ → DR2

MANUFACTURING METHOD FOR DISPLAY DEVICE, PANEL INCLUDING LIGHT EMITTING PANELS FOR MANUFACTURING DISPLAY DEVICE, AND DISPLAY DEVICE

CROSS-REFERENCE TO RELATED APPLICATION

This application claims priority to and the benefit of Korean patent application No. 10-2022-0007305 filed on Jan. 18, 2022 in the Korean Intellectual Property Office, the entire disclosure of which is incorporated by reference herein.

BACKGROUND

1. Field

The present disclosure generally relates to a manufacturing method for a display device, a panel for manufacturing a display device, and a display device.

2. Related Art

Recently, as interest in information displays is increased, research and development of display devices have been continuously conducted.

SUMMARY

One or more embodiments of the present disclosure provide a manufacturing method for a display device, a panel for manufacturing a display device, and a display device, in which static electricity occurring in the display device is prevented (or reduced), so that structural damage can be prevented and light emission efficiency can be improved.

In accordance with one or more embodiments of the present disclosure, there is provided a method for manufacturing a display device, the method including: placing a light emitting element on a substrate including cell areas; placing an insulating layer on the light emitting element; and separating the cell areas from each other, wherein light emitting panels are located on the substrate, correspond to each of the cell areas, and include the light emitting element, wherein the separating of the cell areas from each other includes electrically separating the light emitting panels from each other, and wherein the electrically separating the light emitting panels from each other is performed after the placing of the insulating layer.

The method may further include placing, on the substrate, an alignment electrode including first electrodes, second electrodes, a first alignment line, and a second alignment line.

The placing of the light emitting element may include arranging the light emitting element, based on an electric field between the first electrodes and the second electrodes.

The light emitting panels may include a first light emitting panel and a second light emitting panel. The first light emitting panel and the second light emitting panel may be distinguished from each other with respect to a cutting line extending in one direction. The method may further include placing a cell connection line electrically connecting the first light emitting panel and the second light emitting panel to each other.

The display device may include a plurality of sub-pixels. Before the light emitting element is placed, the first electrodes may be commonly connected to the first alignment line, and the second electrodes may be commonly connected to the second alignment line. The method may further include removing a portion of the alignment electrode. The removing of the portion of the alignment electrode may include removing a portion of the first electrodes such that the plurality of sub-pixels are individually driven without removing at least a portion of the cell connection line.

During the placing of the insulating layer, a portion of the cell connection line may be electrically connected to the first alignment line, and another portion of the cell connection line may be electrically connected to the second alignment line.

The method may further include removing a portion of the alignment electrode. An anode signal may be supplied to the first alignment line, and a cathode signal may be supplied to the second alignment line. The removing of the portion of the alignment electrode may include cutting off the cell connection line electrically connected to the first alignment line without removing a portion of the cell connection line electrically connected to the second alignment line.

The method may further include forming a first contact electrode electrically connecting the light emitting element and the first electrode to each other and a second contact electrode electrically connecting the light emitting element and the second electrodes to each other. The insulating layer may be located on the first contact electrode and the second contact electrode.

The insulating layer may be formed after the light emitting element is located.

The method may further include separating the cell areas from each other. The separating of the cell areas from each other may include: cutting off the substrate along the cutting line; and separating electrical connection between the first light emitting panel and the second light emitting panel.

The cutting off of the substrate and the separating of the electrical connection between the first light emitting panel and the second light emitting panel may be performed through a same process.

The separating of the cell areas from each other may be performed by using a scribing process.

The separating of the electrical connection between the first light emitting panel and the second light emitting panel may be performed after the placing of the insulating layer.

The cell connection line may include a first line extending in a same direction as the cutting line and a second line extending in a direction different from a direction in which the cutting line extends.

The cell connection line may have a structure in which a first cell connection pattern and a second cell connection pattern are sequentially arranged along the direction in which the cutting line extends. The first cell connection pattern may electrically connect first adjacent pads of the first light emitting panel and second adjacent pads of the second light emitting panel to each other, and the second cell connection pattern may electrically connect first separation pads of the first light emitting panel and second separation pads of the second light emitting panel to each other. The first cell connection pattern may electrically connect the first separation pads of the first light emitting panel to each other, and the second cell connection pattern may electrically connect the second separation pads of the second light emitting panel to each other.

The cell connection line may have a structure in which a same cell connection patterns are arranged.

The cell connection line may have a structure in which symmetric cell connection patterns are arranged. The symmetric cell connection pattern may be symmetrical with respect to a direction different from the direction in which the cutting line extends.

In accordance with one or more embodiments of the present disclosure, there is provided a method for manufacturing a display device, the method including: placing a light emitting element on a substrate including a first cell area and a second cell area; placing a cell connection line electrically connecting a first light emitting panel corresponding to the first cell area and a second light emitting panel corresponding to the second cell area to each other; and separating the first cell area and the second cell area from each other, wherein the separating of the first cell area and the second cell area from each other includes: cutting off the substrate such that the first light emitting panel and the second light emitting panel are separated from each other; and cutting off the cell connection line such that the first light emitting panel and the second light emitting panel are electrically separated from each other.

In accordance with one or more embodiments of the present disclosure, there is provided a panel for manufacturing a plurality of display devices, the panel including: a first light emitting panel and a second light emitting panel, disposed on a substrate; and a cell connection line electrically connecting the first light emitting panel and the second light emitting panel to each other, wherein the first light emitting panel and the second light emitting panel are separated from each other by a cutting line extending in one direction, and wherein the cell connection line includes a first line extending in the one direction and a second line extending in a direction different from the one direction.

In accordance with one or more embodiments the present disclosure, there is provided a display device manufactured according to the method.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 6 is a diagram illustrating a pixel circuit included in a sub-pixel in accordance with one or more embodiments of the present disclosure.

FIGS. 15, 17, 19, and 22 are schematic process sectional views illustrating a manufacturing method for the display device in accordance with one or more embodiments of the present disclosure.

DETAILED DESCRIPTION

The present disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the present disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

The present disclosure generally relates to a manufacturing method for a display device, a panel for manufacturing a display device, and a display device. Hereinafter, a display device in accordance with one or more embodiments of the present disclosure will be described with reference to the accompanying drawings.

First, a light emitting element LD in accordance with one or more embodiments of the present disclosure will be described with reference to FIGS. 1 to 4.

Figure 1:
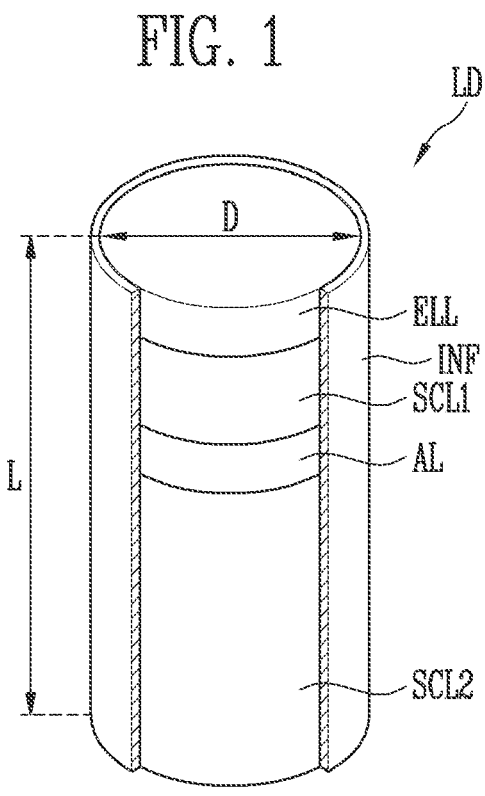
FIGS. 1 and 2 are schematic perspective cutaway and sectional views illustrating a light emitting element in accordance with one or more embodiments of the present disclosure.
Figure 2:
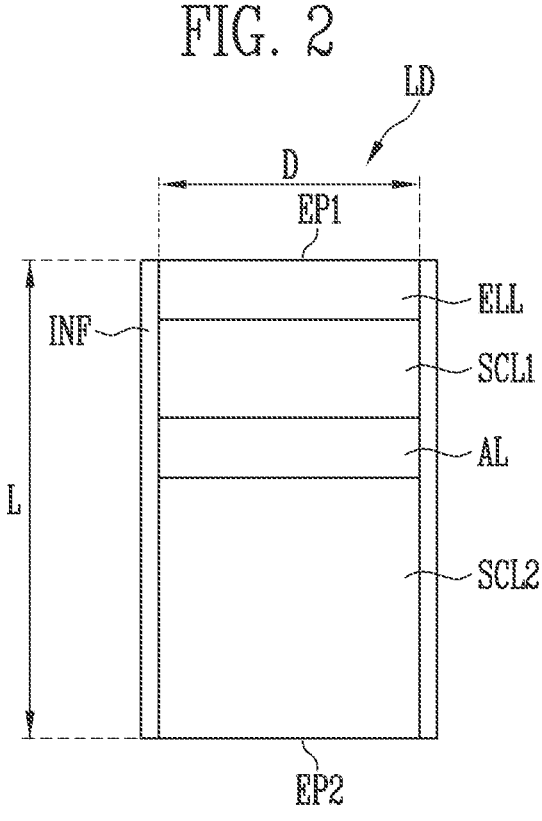
Figure 3:
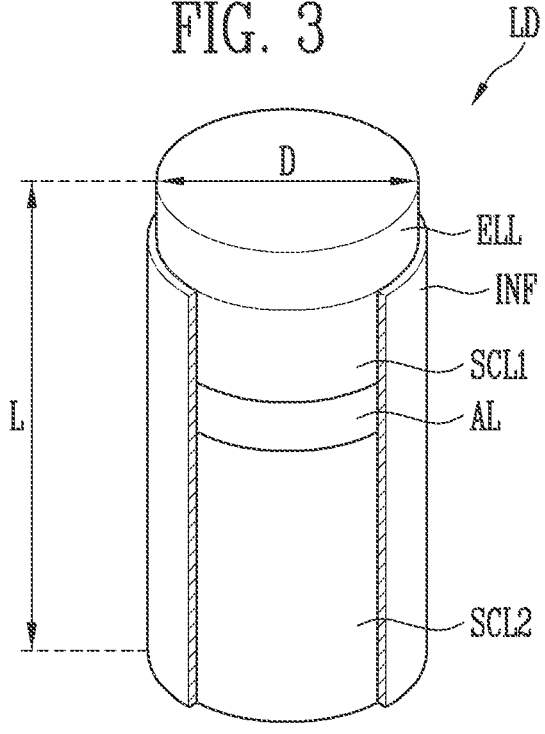
FIGS. 3 and 4 are schematic perspective cutaway and sectional views illustrating a light emitting element in accordance with one or more embodiments of the present disclosure.
Figure 4:
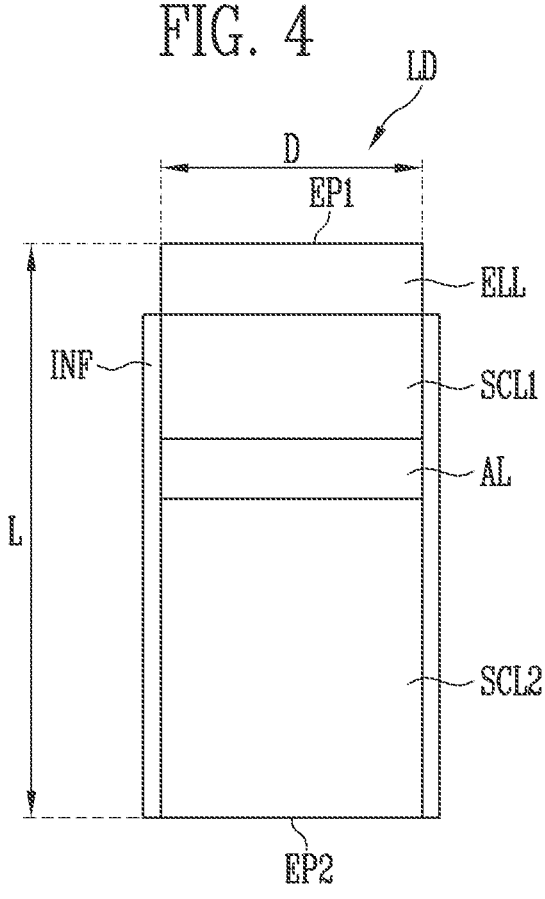

FIGS. 1 and 2 are schematic perspective cutaway and sectional views illustrating a light emitting element in accordance with one or more embodiments of the present disclosure. FIGS. 3 and 4 are schematic perspective cutaway and sectional views illustrating a light emitting element in accordance with one or more embodiments of the present disclosure.

A light emitting element LD included in a display device (see 'DD' shown in FIG. 5) in accordance with one or more embodiments of the present disclosure is illustrated in FIGS. 1 to 4. Although a pillar-shaped light emitting element LD is illustrated in FIGS. 1 to 4, the kind and/or shape of the light emitting element LD is not limited thereto.

The light emitting element LD includes a second semiconductor layer SCL2, a first semiconductor layer SCL1, and an active layer AL interposed between the first and second semiconductor layers SCL1 and SCL2. For example, when assuming that an extending direction of the light emitting element LD is a length L direction, the light emitting element LD may include the first semiconductor layer SCL1, the active layer AL, and the second semiconductor layer SCL2, which are sequentially stacked along the length L direction.

In accordance with one or more embodiments, the light emitting element LD may further include an electrode layer ELL and an insulative film INF.

The light emitting element LD may be provided in a pillar shape extending along one direction. The light emitting element LD may have a first end portion EP1 and a second end portion EP2. The first semiconductor layer SCL1 may be adjacent to the first end portion EP1, and the second semiconductor layer SCL2 may be adjacent to the second end portion EP2. The electrode layer ELL may be adjacent to the first end portion EP1 of the light emitting element LD.

The light emitting element LD may be a light emitting element manufactured in a pillar shape through an etching process, or the like. In this specification, the term "pillar shape" may include a rod-like shape or bar-like shape, which is long in the length L direction (i.e., its aspect ratio is greater than 1), such as a cylinder or a polyprism, and the shape of its section is not particularly limited. For example, a length L of the light emitting element LD may be greater than a diameter D (or a width of a cross-section) of the light emitting element LD.

The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may be a first conductivity type semiconductor layer. The first semiconductor layer SCL1 is disposed on the active layer AL, and may include a semiconductor layer having a type different from a type of the second semiconductor layer SCL2. For example, the first semiconductor layer SCL1 may include a P-type semiconductor layer. In an example, the first semiconductor layer SCL1 may include at least one semiconductor material from among InAlGaN, GaN, AlGaN, InGaN, AlN, and InN, and include a P-type semiconductor layer doped with a first conductivity type dopant such as Mg. However, the material constituting the first semiconductor layer SCL1 is not limited thereto. In addition, the first semiconductor layer SCL1 may be configured with various materials.

The active layer AL is disposed on the second semiconductor layer SCL2, and may be formed in a single-quantum well structure or a multi-quantum well structure. The position of the active layer AL may be variously changed according to the kind (or type) of the light emitting element LD.

A clad layer doped with a conductive dopant may be formed on the top and/or the bottom of the active layer AL. For example, the clad layer may be an AlGaN layer or an InAlGaN layer. In one or more embodiments, a material such as AlGaN or AlInGaN may be used to form the active layer AL. In addition, the active layer AL may be configured with various materials.

The second semiconductor layer SCL2 may be a second conductivity type semiconductor layer. The second semiconductor layer SCL2 is disposed on the active layer AL, and may include a semiconductor layer having a type different from the type of the first semiconductor layer SCL1. For example, the second semiconductor layer SCL2 may include an N-type semiconductor layer. For example, the second semiconductor layer SCL2 may include any one semiconductor material from among InAlGaN, GaN, AlGaN, InGaN, AlN, and InN, and include an N-type semiconductor layer doped with a second conductivity type dopant such as Si, Ge or Sn. However, the material constituting the second semiconductor layer SCL2 is not limited thereto. In addition, the second semiconductor layer SCL2 may be configured with various materials.

When a voltage which is a threshold voltage or more is applied between both ends of the light emitting element LD, the light emitting element LD emits light as electron-hole pairs are combined in the active layer AL. The light emission of the light emitting element LD is controlled by using such a principle, so that the light emitting element LD can be used as a light source for various light emitting devices, including a pixel of a display device.

The insulative film INF may be disposed on a surface of the light emitting element LD. The insulative film INF may be formed on the surface of the light emitting element LD to be around (e.g., to surround) an outer surface (e.g., an outer peripheral or circumferential surface) of at least the active layer AL. The insulative film INF may surround one areas of the first and second semiconductor layers SCL1 and SCL2 and the electrode layer ELL.

The insulative film INF may be formed as a single layer or a multi-layer. However, the present disclosure is not limited thereto, and the insulative film INF may be configured with a plurality of layers.

The insulative film INF may expose both the end portions of the light emitting element LD, which have different polarities. For example, the insulative film INF may expose one end of each of the electrode layer ELL and the second semiconductor layer SCL2, which are respectively adjacent to the first and second end portions EP1 and EP2 of the light emitting element LD. In one or more embodiments, the insulative film INF may expose side portions of the electrode layer ELL of the light emitting element LD, which have different polarities (see FIGS. 3 and 4). In one or more embodiments, the insulative film INF may expose side portions of the first semiconductor layer SCL1 and the second semiconductor layer SCL2.

The insulative film INF may be configured as a single layer or a multi-layer, including one material from among silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto. For example, in accordance with another embodiment, the insulative film INF may be omitted.

In accordance with one or more embodiments, when the insulative film INF is provided to cover the surface of the light emitting element LD, particularly, the outer surface of the active layer AL, the electrical stability of the light emitting element LD can be ensured. Also, when the insulative film INF is provided on the surface of the light emitting element LD, a surface defect of the light emitting element LD is reduced or minimized, thereby improving the lifetime and efficiency of the light emitting element LD. In addition, even when a plurality of light emitting elements LD are densely disposed, an unwanted short circuit can be prevented from occurring between the light emitting elements LD.

The electrode layer ELL may be disposed on the first semiconductor layer SCL1. The electrode layer ELL may be adjacent to the first end portion EP1. The electrode layer ELL may be electrically connected to the first semiconductor layer SCL1.

A portion of the electrode layer ELL may be exposed. For example, the electrode layer ELL may be exposed in an area corresponding to the first end portion EP1.

In one or more embodiments, a side surface of the electrode layer ELL may be exposed (see FIGS. 3 and 4). For example, the insulative film INF may not cover at least a portion of the side surface of the electrode layer ELL while covering a side surface of each of the first semiconductor layer SCL1, the active layer AL, and the second semiconductor layer SCL2. Thus, the electrode layer ELL adjacent to the first end portion EP1 can be easily connected to another component. In one or more embodiments, the insulating layer INF may expose not only the side surface of the electrode layer ELL but also a portion of a side surface of the first semiconductor layer SCL1 and/or the second semiconductor layer SCL2.

In accordance with one or more embodiments, the electrode layer ELL may be an ohmic contact electrode. However, the present disclosure is not necessarily limited to the above-described example. For example, the electrode layer ELL may be a Schottky contact electrode.

In accordance with one or more embodiments, the electrode layer ELL may include one of chromium (Cr), titanium (Ti), aluminum (Al), gold (Au), nickel (Ni), and any oxide or ally thereof. However, the present disclosure is not necessarily limited to the above-described example. In one or more embodiments, the electrode layer ELL may be substantially transparent. For example, the electrode layer ELL may include indium tin oxide (ITO). Accordingly, emitted light can be transmitted through the electrode layer ELL.

The structure, shape, and the like of the light emitting element LD are not limited to the above-described example. In one or more embodiments, the light emitting element LD may have various structures and various shapes. For example, the light emitting element LD may further include a phosphor layer, an active layer, a semiconductor layer, and/or an electrode layer. In one or more embodiments, the light emitting element LD may further include an additional electrode layer that is disposed on one surface of the second semiconductor layer SCL2 and is adjacent to the second end portion EP2.

Figure 5:
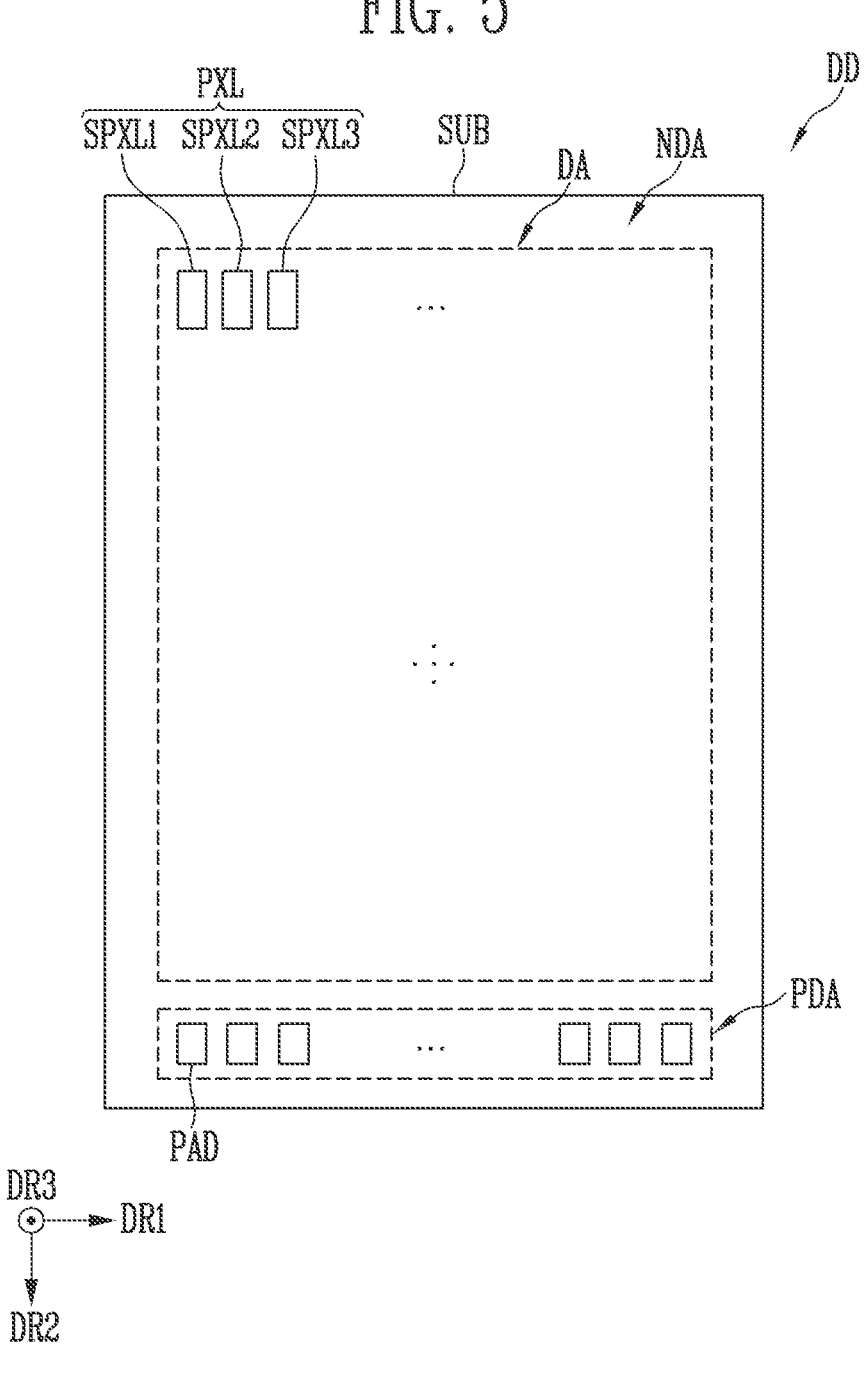
FIG. 5 is a schematic plan view illustrating a display device in accordance with one or more embodiments of the present disclosure.

FIG. 5 is a schematic plan view illustrating a display device in accordance with one or more embodiments of the present disclosure.

The display device DD is configured to emit light. In accordance with one or more embodiments, the display device DD may be manufactured according to a manufacturing method for a display device, which will be described later with reference to FIGS. 13 to 26.

Referring to FIG. 5, the display device DD may include a substrate SUB and pixels PXL arranged on the substrate SUB. The display device DD may include pads PAD.

In one or more embodiments, the display device DD may further include a driving circuit (e.g., a scan driver and a data driver) for driving the pixels PXL, and lines.

The display device DD may include a display area DA and a non-display area NDA. The non-display area NDA may refer to an area except the display area DA. The non-display area NDA may be around (e.g., may surround) at least a portion of the display area DA along an edge or a periphery of the display area DA. In one or more embodiments, the display area DA may be designated as an active area, and the non-display area NDA may be designated as a non-active area.

The substrate SUB may constitute a base member of the display device DD. The substrate SUB may be a rigid or flexible substrate or film, but the present disclosure is not limited to a specific example. For example, the substrate SUB may be a rigid substrate made of glass or tempered glass, a flexible substrate (or thin film) made of a plastic or metal material, or at least one insulating layer. The material and/or property of the substrate SUB is not particularly limited.

The display area DA may refer to an area in which the pixels PXL are disposed. The non-display area NDA may refer to an area in which the pixels PXL are not disposed. The driving circuit, the lines, and the pads, which are connected to the pixels PXL of the display area DA, may be disposed in the non-display area NDA.

For example, the pixels PXL may be arranged according to a stripe arrangement structure, a PENTILE® arrangement structure, or the like, but the present disclosure is not limited thereto and various embodiments known in the art may be applied. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea.

In accordance with one or more embodiments, the pixel PXL may include a first sub-pixel SPXL1, a second sub-pixel SPXL2, and a third sub-pixel SPXL3. In one or more embodiments, the first sub-pixel SPXL1, the second sub-pixel SPXL2, and the third sub-pixel SPXL3 may constitute one pixel unit capable of emitting lights of various colors.

For example, each of the first sub-pixel SPXL1, the second sub-pixel SPXL2, and the third sub-pixel SPXL3 may emit light of a color (e.g., a predetermined color). In an example, the first sub-pixel SPXL1 may be a red pixel emitting light of red color (e.g., a first color), the second sub-pixel SPXL2 may be a green pixel emitting light of green color (e.g., a second color), and the third sub-pixel SPXL3 may be a blue pixel emitting light of blue color (e.g., a third color). However, the color, kind, and/or number of first, second, and third sub-pixels SPXL1, SPXL2, and SPXL3 constituting each pixel unit are not limited to a specific example.

The display device DD may further include a pad area PDA. The pads PAD may be disposed in the pad area PDA.

The pads PAD may include scan pads to which a scan signal is provided and data pads to which a data signal is provided. The scan pads may receive a scan signal provided from the scan driver, and provide the scan signal to a scan line of the pixel PXL. The data pads may receive a data signal, and provide the data signal to a data line of the pixel PXL.

The pads PAD may include alignment pads capable of receiving an alignment signal for aligning light emitting elements in the pixel PXL. For example, the alignment pads may receive an alignment signal for aligning light emitting elements, and provide the alignment signal to a first alignment line (see 'AL1' shown in FIG. 14) and a second alignment line (see 'AL2' shown in FIG. 14). In one or more embodiments, an anode signal may be provided to the first alignment line AL1, and a cathode signal may be provided to the second alignment line AL2.

In accordance with one or more embodiments, the pad area PDA may be disposed at one side of the display area DA. Although an embodiment in which a single pad area PDA is provided has been illustrated in FIG. 5, the present disclosure is not limited thereto. In one or more embodiments, the pad area PDA may be provided in plurality. For example, one of the plurality of pad areas PDA may be disposed at one side of the display area DA, and another of the plurality of pad areas PDA may be disposed at another side of the display area DA.

Figure 6:
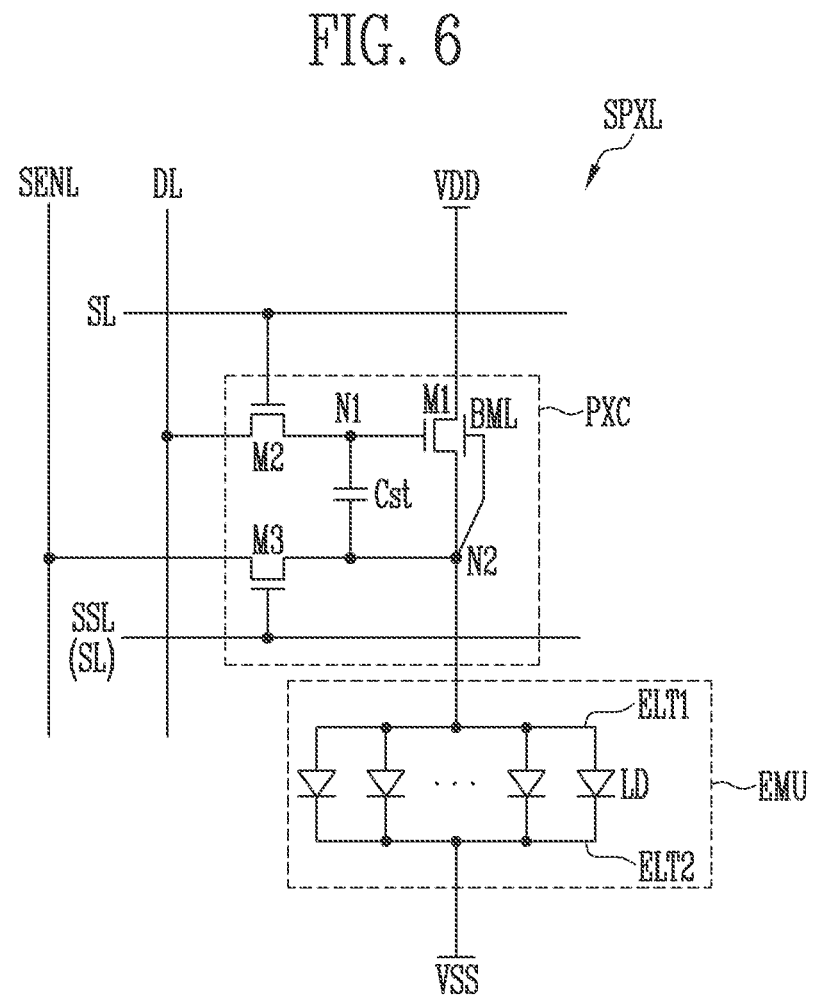

FIG. 6 is a diagram illustrating a pixel circuit included in a sub-pixel in accordance with one or more embodiments of the present disclosure. The sub-pixel SPXL shown in FIG. 6 may refer to any one of the first to third sub-pixels SPXL1, SPXL2, and SPXL3 described above with reference to FIG. 5.

Referring to FIG. 6, the sub-pixel SPXL may include a pixel circuit PXC. The pixel circuit PXC may be configured to drive a light emitting unit EMU including at least one light emitting elements LD.

The sub-pixel SPXL may be electrically connected to a scan line SL, a data line DL, a first power line VDD, and a second power line VSS. For convenience of description, the scan line SL will be mainly described. In one or more embodiments, the sub-pixel SPXL may be selectively further connected to another power line and/or another signal line.

The sub-pixel SPXL may include the light emitting unit EMU configured to emit light corresponding to a data signal provided from the data line DL.

The pixel circuit PXC may be disposed between the first power line VDD and the light emitting unit EMU. The pixel circuit PXC may be electrically connected to the scan line SL to which a first scan signal is supplied and the data line DL to which a data signal is supplied. Also, the pixel circuit PXC may be electrically connected to a control line SSL to which a second scan signal is supplied, and may be electrically connected to a sensing line SENL connected to a reference power source (or initialization power source) or a sensing circuit. In one or more embodiments, the second scan signal may be identical to or different from the first scan signal. When the second scan signal and the first scan signal are identical to each other, the control line SSL may be integrated with the scan line SL.

The pixel circuit PXC may include at least one transistor and a capacitor. For example, the pixel circuit PXC may include a first transistor M1, a second transistor M2, a third transistor M3, and a capacitor Cst.

The first transistor M1 (e.g., a driving transistor) may be connected between the first power line VDD and a second node N2. The second node N2 may be a node at which the pixel circuit PXC and the light emitting unit EMU are connected to each other. For example, the second node N2 may be a node at which one electrode (e.g., a source electrode) of the first transistor M1 and a first electrode ELT1 (e.g., an anode electrode) of the light emitting unit EMU are connected to each other. A gate electrode of the first transistor M1 may be connected to a first node N1. The first transistor M1 may control a driving current supplied to the light emitting unit EMU, corresponding to a voltage of the first node N1.

In one or more embodiments, the first transistor M1 may further include a lower auxiliary electrode BML (or back gate electrode). The gate electrode and the lower auxiliary electrode BML of the first transistor M1 may overlap with each other with an insulating layer interposed therebetween. In one or more embodiments, the lower auxiliary electrode BML may be connected to the one electrode, e.g., the source electrode of the first transistor M1.

In one or more embodiments in which the first transistor M1 includes the lower auxiliary electrode BML, there may be applied a back-biasing technique (or sync technique) for moving a threshold voltage of the first transistor M1 in a negative direction or positive direction by applying a back-biasing voltage to the lower auxiliary electrode BML of the first transistor M1. In addition, when the lower auxiliary electrode BML is disposed on the bottom of a semiconductor pattern constituting a channel of the first transistor M1, the lower auxiliary electrode BML blocks light incident onto the semiconductor pattern, thereby stabilizing operational characteristics of the first transistor M1.

The second transistor M2 (e.g., a switching transistor) may be connected between the data line DL and the first node N1. In addition, a gate electrode of the second transistor M2 may be connected to the scan line SL. The second transistor M2 may be turned on when the first scan signal having a gate-on voltage (e.g., a high level voltage) is supplied from the scan line SL, to connect the data line DL and the first node N1 to each other.

A data signal of a corresponding frame is supplied to the data line for each frame period. The data signal is transferred to the first node N1 through the second transistor M2 during a period in which the first scan signal having the gate-on voltage is supplied. That is, the second transistor M2 may be a switching transistor for transferring each data signal to the inside of the sub-pixel SPXL.

One electrode of the capacitor Cst may be connected to the first node N1, and the other electrode of the capacitor Cst may be connected to the second node N2. The capacitor Cst charges a voltage (or holds a charge) corresponding to the data signal supplied to the first node N1 during each frame period.

The third transistor M3 may be connected between the second node N2 and the sensing line SENL. In addition, a gate electrode of the third transistor M3 may be connected to the control line SSL (or the scan line SL). The third transistor M3 may be turned on when the second scan signal (or the first scan signal) having the gate-on voltage (e.g., the high level voltage) is supplied from the control line SSL, to transfer, to the second node N2, a reference voltage (or initialization voltage) supplied to the sensing line SENL, or to transfer a voltage of the second node N2 to the sensing line SENL. The voltage of the second node N2, which is transferred to the sensing circuit through the sensing line SENL, may be provided to an external circuit (e.g., a controller) to be used for compensating for a characteristic deviation of sub-pixels SPXL, and the like.

Although a case where the transistors included in the pixel circuit PXC are all N-type transistors is illustrated in FIG. 6, the present disclosure is not limited thereto. For example, at least one of the first, second, and third transistors M1, M2, and M3 may be changed to a P-type transistor. In addition, the structure and driving method of the sub-pixel SPXL may be variously changed in some embodiments.

The light emitting unit EMU may include the first electrode ELT1, a second electrode ELT2, and at least one light emitting element LD. For example, the light emitting unit EMU may include the first electrode ELT1 connected to the first power line VDD through the first transistor M1, the second electrode ELT2 connected to the second power line VSS, and the at least one light emitting elements LD connected between the first electrode ELT1 and the second electrode ELT2. In one or more embodiments, the light emitting unit EMU may include a plurality of light emitting elements LD connected in parallel between the first electrode ELT1 and the second electrode ELT2.

A power source of the first power line VDD and a power source of the second power line VSS may have different potentials. For example, the power source of the first power line VDD may be a high-potential pixel power source, and the power source of the second power line VSS may be a low-potential pixel power source. A potential difference between the power source of the first power line VDD and the power source of the second power line VSS may be set equal to or higher than a threshold voltage of the light emitting elements LD.

The emitting elements LD may be connected in a forward direction between the first power line VDD and the second power line VSS to form respective effective light sources. These effective light sources constitute the light emitting unit EMU of the sub-pixel SPXL.

The light emitting elements LD may emit light with a luminance corresponding to a driving current supplied through the pixel circuit PXC. The pixel circuit PXC may supply a driving current corresponding to a data signal to the light emitting unit EMU during each frame period. The driving current supplied to the light emitting unit EMU may be divided to flow through the light emitting elements LD. Accordingly, the light emitting unit EMU can emit light with a luminance corresponding to the driving current while each light emitting element LD emits light with a luminance corresponding to a current flowing therethrough.

Although an embodiment in which the sub-pixel SPXL includes the light emitting unit EMU having a parallel structure is disclosed in FIG. 6, the present disclosure is not limited thereto. For example, the sub-pixel SPX may include a light emitting unit EMU having a serial structure or a series/parallel structure. The light emitting unit EMU may include a plurality of light emitting elements LD connected in series or series/parallel between the first electrode ELT1 and the second electrode ELT2. Alternatively, the sub-pixel SPXL may include only a single light emitting element LD connected between the first electrode ELT1 and the second electrode ELT2.

Figure 7:
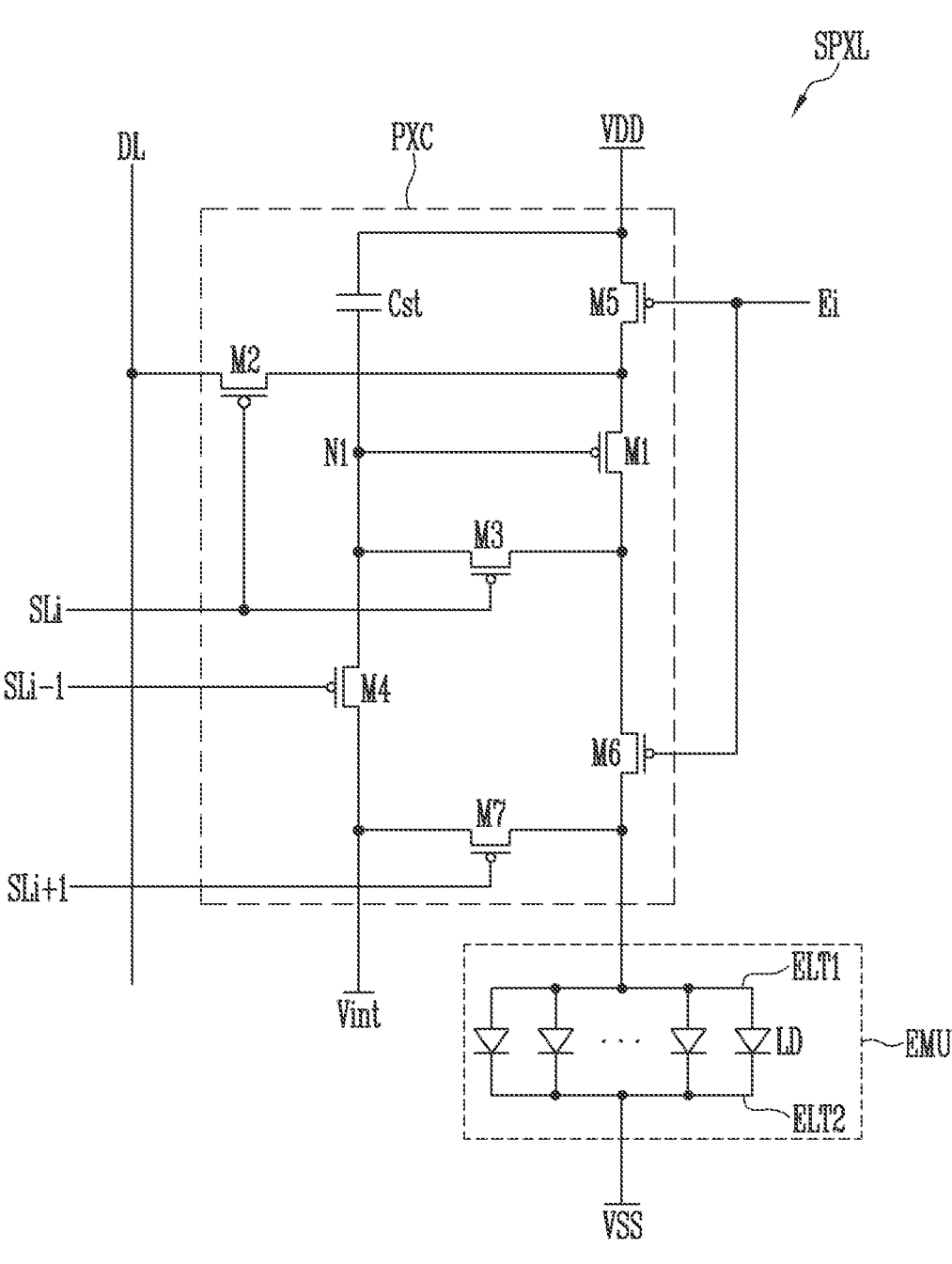
FIG. 7 is a diagram illustrating a pixel circuit included in the sub-pixel in accordance with one or more embodiments of the present disclosure.

The pixel circuit PXC of the sub-pixel SPXL in accordance with one or more embodiments of the present disclosure is not limited to the above-described example. Hereinafter, a pixel circuit PXC in accordance with another embodiment of the present disclosure will be described with reference to FIG. 7. In FIG. 7, descriptions of portions overlapping with those described above will be omitted or simplified.

FIG. 7 is a diagram illustrating a pixel circuit included in the sub-pixel in accordance with one or more embodiments of the present disclosure. The sub-pixel SPXL shown in FIG. 7 may refer to any one of the first to third sub-pixels SPXL1, SPXL2, and SPXL3 described above with reference to FIG. 5.

Referring to FIG. 7, the sub-pixel SPXL may include a pixel circuit PXC. The pixel circuit PXC may be configured to drive a light emitting unit EMU including at least one light emitting elements LD.

The pixel circuit PXC may include first to seventh transistors M1 to M7 and a storage capacitor Cst. The pixel circuit PXC may be electrically connected to the light emitting unit EMU. The pixel circuit PXC may be electrically connected to the light emitting element LD.

One electrode of the first transistor M1 may be connected to a first power line VDD via the fifth transistor M5, and the other electrode of the first transistor M1 may be connected to a first electrode ELT1 (e.g., an anode electrode) of the light emitting unit EMU via the sixth transistor M6. The first transistor M1 may control current data flowing from the first power line VDD to a second power line VSS via the light emitting unit EMU, based on information on a voltage of a first node N1 to which a gate electrode of the first transistor M1 is connected. The first transistor M1 may be a driving transistor.

The second transistor M2 may be connected between the one electrode of the first transistor M1 and a data line DL. A gate electrode of the second transistor M2 may be connected to an ith scan line SLi. The second transistor M2 may be turned on when a scan signal is applied from the ith scan line SLi, and electrically connect the data line DL and the one electrode of the first transistor M1 to each other. The second transistor M2 may be a switching transistor.

The third transistor M3 may be connected between the other electrode of the first transistor M1 and the first node N1. A gate electrode of the third transistor M3 may be connected to the ith scan line SLi. The third transistor M3 may be turned on when the scan signal having a gate-on voltage is applied from the ith scan line SLi, and electrically connect the other electrode of the first transistor M1 and the first node N1 to each other. When the third transistor M3 is turned on, the first transistor M1 may be connected in a diode form (e.g., the first transistor M1 may be diode-connected).

The fourth transistor M4 may be connected between the first node and an initialization power line Vint. A gate electrode of the fourth transistor M4 may be connected to an (i−1)th scan line SLi−1 (e.g., a previous scan line). The fourth transistor M4 may be turned on when a scan signal is applied from the (i−1)th scan line SLi−1, to supply a voltage of the initialization power line Vint to the first node N1. The fourth transistor M4 may be an initialization transistor.

The fifth transistor M5 may be connected between the first power line VDD and the first transistor M1. A gate electrode of the fifth transistor M5 may be connected to an ith emission control line Ei. The fifth transistor M5 may be turned on when an emission control signal having a gate-on voltage is applied to the ith emission control line Ei, and be turned off when an emission control signal having a gate-off voltage is applied to the ith emission control line Ei.

The sixth transistor M6 may be connected between the first transistor M1 and the light emitting unit EMU. A gate electrode of the sixth transistor M6 may be connected to the ith emission control line Ei. The sixth transistor M6 may be turned on when the emission control signal having a gate-on voltage (e.g., a low level voltage) is applied from the ith emission control line Ei, and be turned off when an emission control signal having a gate-off voltage is applied to the ith emission control line Ei in other cases.

The seventh transistor M7 may be connected between the initialization power line Vint and the first electrode ELT1 (e.g., the anode electrode) of the light emitting unit EMU. A gate electrode of the seventh transistor M7 may be connected to an (i+1)th scan line SLi+1 (e.g., a next scan line). The seventh transistor M7 may be turned on when a scan signal having a gate-on voltage (e.g., a low level voltage) is applied from the (i+1)th scan line SLi+1, to supply the voltage of the initialization power line Vint to the first electrode ELT1 of the light emitting unit EMU. A signal applied to the gate electrode of the seventh transistor M7 may be a signal having the same timing as the scan signal having the gate-on voltage, which is applied from the ith scan line SLi.

The voltage of the initialization power line Vint may be set as a voltage lower than a data signal. For example, the voltage of the initialization power line Vint may be set equal to or lower than a minimum voltage of the data signal.

The storage capacitor Cst may be connected between the first power line VDD and the first node N1. The storage capacitor Cst may store information on a voltage corresponding to the data signal and a threshold voltage of the first transistor M1.

The first electrode ELT1 of the light emitting unit EMU may be connected to the first transistor M1 via the sixth transistor M6. A second electrode ELT2 (e.g., a cathode electrode) of the light emitting unit EMU may be connected to the second power line VSS.

Figure 8:
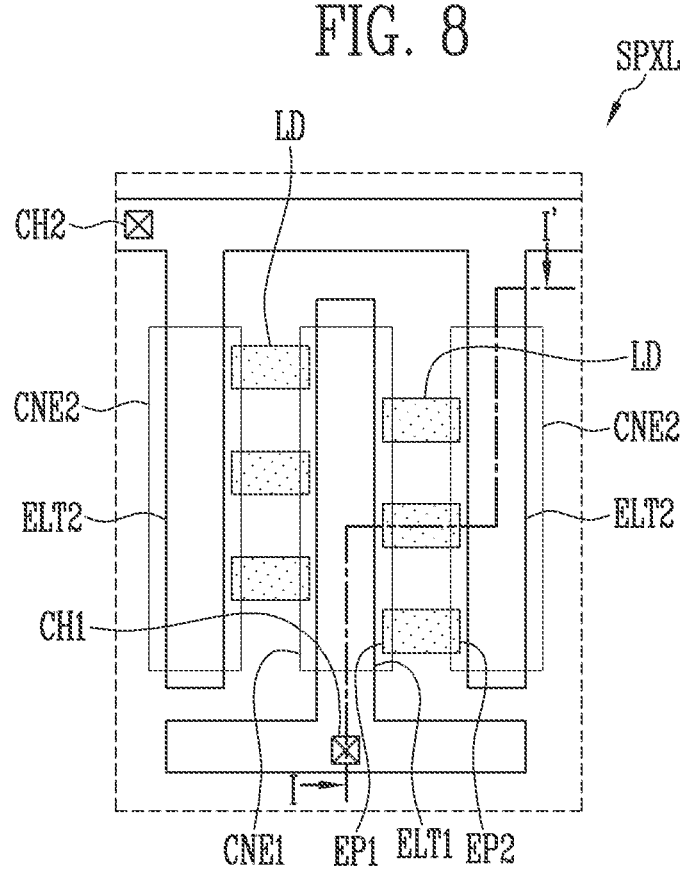
FIG. 8 is a plan view schematically illustrating a sub-pixel in accordance with one or more embodiments of the present disclosure.
Figure 8:
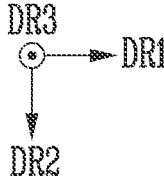

FIG. 8 is a plan view schematically illustrating a sub-pixel in accordance with one or more embodiments of the present disclosure.

FIG. 8 may be a layout view schematically illustrating one or more components of a display element layer (see 'DPL' shown in FIG. 9) of the sub-pixel SPXL. An embodiment of an arrangement structure light emitting elements LD is illustrated in FIG. 8, and the arrangement structure of the light emitting elements LD is not particularly limited to FIG. 8. The sub-pixel SPXL shown in FIG. 8 may be one of the first to third sub-pixels SPXL1, SPXL2, and SPXL3.

The light emitting elements LD may form a light emitting unit, thereby serving as a light source of the sub-pixel SPXL (or the pixel PXL).

Referring to FIG. 8, the sub-pixel SPXL may include a first electrode ELT1, a second electrode ELT2, and light emitting elements LD disposed between the first electrode ELT1 and the second electrode ELT2. The sub-pixel SPXL may further include a first contact electrode CNE1 and a second contact electrode CNE2.

At least a portion of the light emitting element LD may be disposed between the first electrode ELT1 and the second electrode ELT2. The light emitting element LD may be aligned between the first electrode ELT1 and the second electrode ELT2.

The first electrode ELT1 and the second electrode ELT2 may be spaced from each other. For example, the first electrode ELT1 and the second electrode ELT2 may be spaced from each other along a first direction DR1 in each emission area (e.g., an emission area of each sub-pixel SPXL), and each of the first electrode ELT1 and the second electrode ELT2 may extend along a second direction DR2.

Each of the first electrode ELT1 and the second electrode ELT2 may have a pattern separated for each sub-pixel SPXL, or have a pattern commonly connected in a plurality of sub-pixels SPXL.

For example, the first electrode ELT1 may have an independent pattern for each sub-pixel SPXL, and may be separated from a first electrode ELT1 of an adjacent sub-pixel SPXL. A second electrode ELT2 of each of adjacent sub-pixels SPXL may be commonly connected to the same electrode. However, the present disclosure is not necessarily limited to the above-described example. In one or more embodiments, the second electrode ELT2 may have an independent pattern for each sub-pixel SPXL, and may be separated from a second electrode ELT2 of an adjacent sub-pixel SPXL.

In a process of forming sub-pixels SPXL, particularly, before the light emitting elements LD are completely aligned, first electrodes ELT1 of the sub-pixels SPXL may be connected to each other, and second electrodes ELT2 of the sub-pixels SPXL may be connected to each other.

The first electrode ELT1 and the second electrode ELT2 may be respectively supplied with a first alignment signal and a second alignment signal in a process of aligning the light emitting elements LD. The first alignment signal and the second alignment signal may have different waveforms, different potentials, and/or different phases. Accordingly, an electric field is formed between the first electrode ELT1 and the second electrode ELT2, so that the light emitting elements can be alignment between the first electrode ELT1 and the second electrode ELT2. After the light emitting elements LD are completely aligned, at least a portion of at least the first electrode ELT1 may be cut off so that first electrodes ELT1 of sub-pixels SPXL are separated from each other. Accordingly, the sub-pixels SPXL can be individually driven. This will be described in detail later.

The first electrode ELT1 may be electrically connected to at least one circuit element (e.g., the first transistor M1) through a first contact hole CH1. The first electrode ELT1 may provide an anode signal to the light emitting element LD.

The second electrode ELT2 may be electrically connected to the second power line VSS through a second contact hole CH2. The second electrode ELT2 may provide a cathode signal to the light emitting element LD.

Each of the first and second electrodes ELT1 and ELT2 may be configured as a single layer or a multi-layer. For example, each of the first and second electrodes ELT1 and ELT2 may include at least one reflective electrode layer including a reflective conductive material, and selectively further include a least one transparent electrode layer and/or at least one conductive capping layer.

The light emitting elements LD may be aligned between the first electrode ELT1 and the second electrode ELT2. For example, the light emitting elements LD may be aligned and/or connected in parallel between the first electrode ELT1 and the second electrode ELT2.

In one or more embodiments, each light emitting element LD may be aligned in the second direction DR2 between the first electrode ELT1 and the second electrode ELT2, to be electrically connected to the first and second electrodes ELT1 and ELT2. Although a case where all the light emitting elements LD are uniformly aligned in the second direction DR2 is illustrated in FIG. 8, the present disclosure is not limited thereto. For example, at least one of the light emitting elements LD may be arranged in an oblique direction inclined with respect to the extending direction of the first and second electrodes ELT1 and ELT2, or the like.

A first end portion EP1 of the light emitting element LD may be disposed adjacent to the first electrode ELT1, and a second end portion EP2 of the light emitting element LD may be disposed adjacent to the second electrode ELT2. The first end portion EP1 may or may not overlap with the first electrode ELT1. The second end portion EP2 may or may not overlap with the second electrode ELT2.

In one or more embodiments, the first end portion EP1 of each of the light emitting elements LD may be electrically connected to the first electrode ELT1 through the first contact electrode CNE1. In one or more embodiments, the first end portion EP1 of each of the light emitting elements LD may be directly connected to the first electrode ELT1. In one or more embodiments, the first end portion EP1 of each of the light emitting elements LD is electrically connected to only the first contact electrode CNE1, and may not be connected to the first electrode ELT1.

Similarly, the second end portion EP2 of each of the light emitting elements LD may be electrically connected to the second electrode ELT2 through the second contact electrode CNE2. In one or more embodiments, the second end portion EP2 of each of the light emitting elements LD may be directly connected to the second electrode ELT2. In one or more embodiments, the second end portion EP2 of each of the light emitting elements LD is electrically connected to only the second contact electrode CNE2, and may not be connected to the second electrode ELT2.

The light emitting elements LD may be provided (or prepared) in a form in which the light emitting elements LD are dispersed in a solution (e.g., a predetermined solution), to be supplied to an emission area of each sub-pixel SPXL through an inkjet printing process, a slit coating process, or the like. When alignment signals (e.g., predetermined alignment signals) are provided to first and second electrodes ELT1 and ELT2 of the sub-pixels SPXL in a state in which light emitting elements LD are supplied to each emission area, the light emitting elements LD are aligned between the first and second electrodes ELT1 and ELT2, based on the provided alignment signals. After the light emitting elements LD are aligned, the solution may be removed through a drying process, or the like.

The first contact electrode CNE1 and the second contact electrode CNE2 may be respectively disposed on the first end portions EP1 and the second end portions EP2 of the light emitting elements LD.

The first contact electrode CNE1 may be disposed on the first end portions EP1 of the light emitting elements LD to be electrically connected to the first end portions EP1. In one or more embodiments, the first contact electrode CNE1 may be disposed on the first electrode ELT1 to be electrically connected to the first electrode ELT1. The first end portions EP1 of the light emitting elements LD may be connected to the first electrode ELT1 through the first contact electrode CNE1.

The second contact electrode CNE2 may be disposed on the second end portions EP2 of the light emitting elements LD to be electrically connected to the second end portions EP2. In one or more embodiments, the second contact electrode CNE2 may be disposed on the second electrode ELT2 to be electrically connected to the second electrode ELT2. The second end portions EP2 of the light emitting element LD may be connected to the second electrode ELT2 through the second contact electrode CNE2.

FIGS. 9 to 12 are sectional views schematically illustrating sub-pixels in accordance with embodiments of the present disclosure. FIGS. 9 to 12 schematically illustrate a sectional structure of the sub-pixel SPXL disposed in the display area DA. FIGS. 9 to 12 are schematic sectional views taken along the line I-I' shown in FIG. 8. For convenience of description, only the first transistor M1 among the circuit components of the pixel circuit PXC is illustrated in FIGS. 9 to 12.

Figure 9:
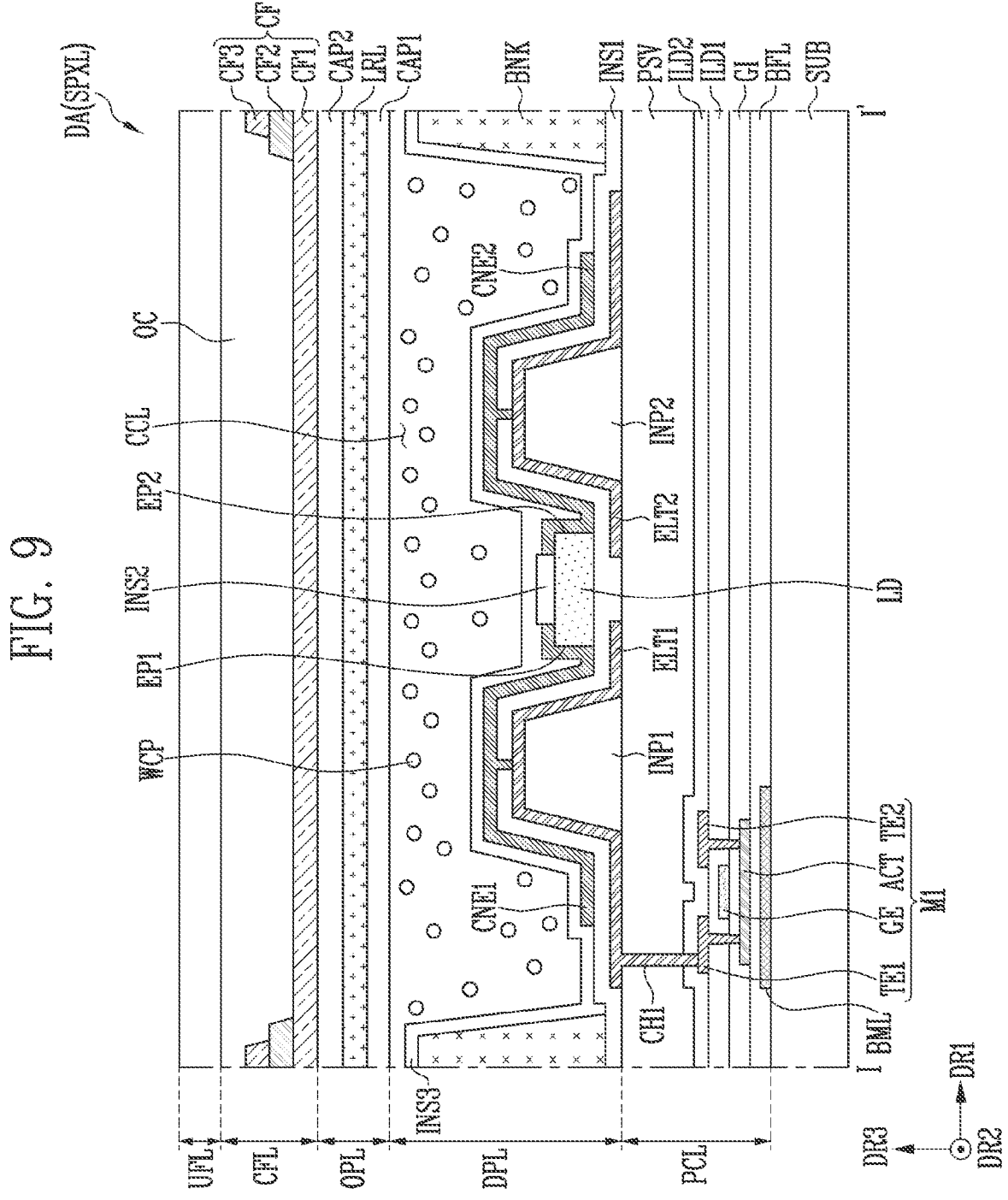
FIGS. 9 to 12 are sectional views schematically illustrating sub-pixels in accordance with one or more embodiments of the present disclosure.
Figure 10:
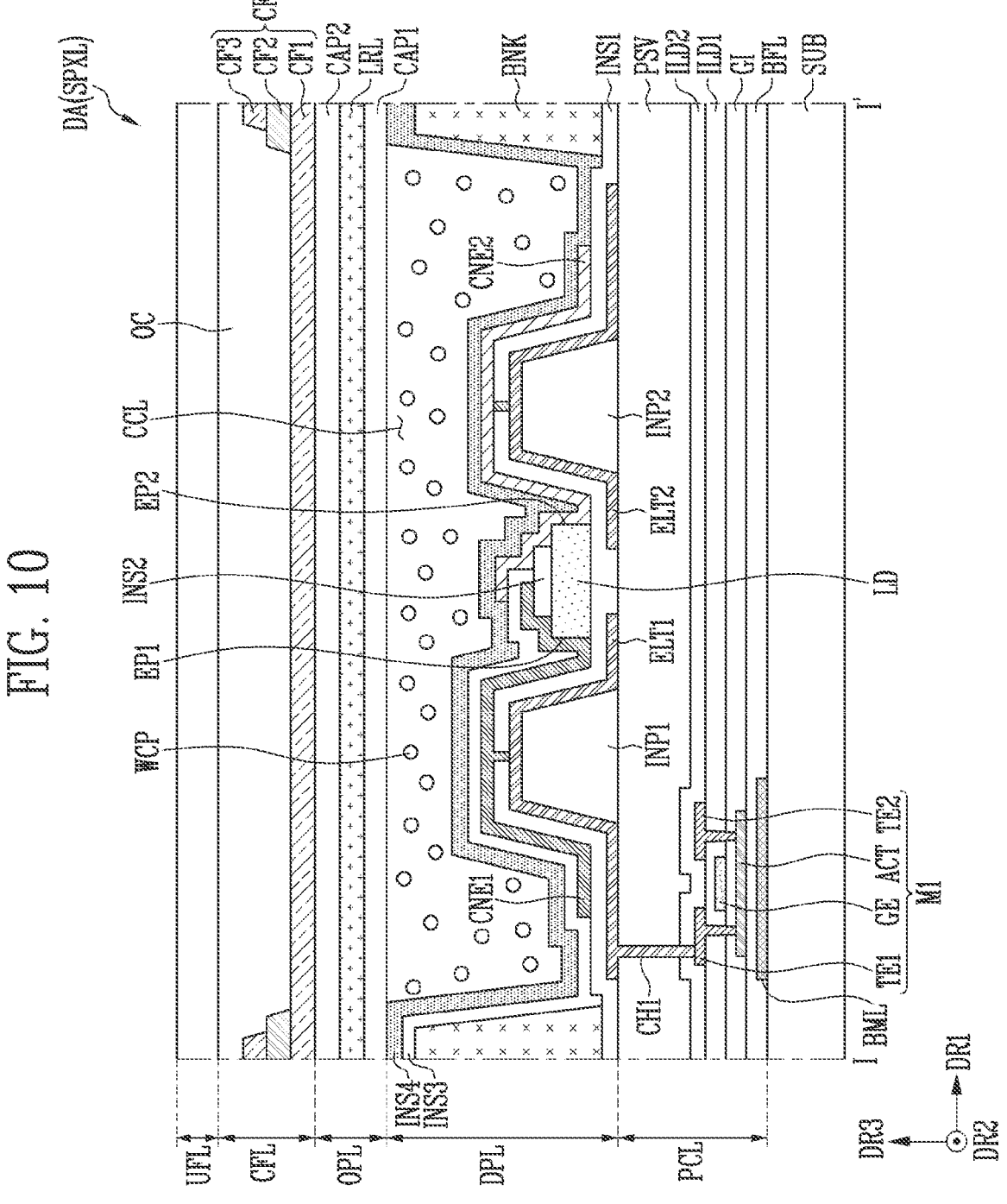
Figure 11:
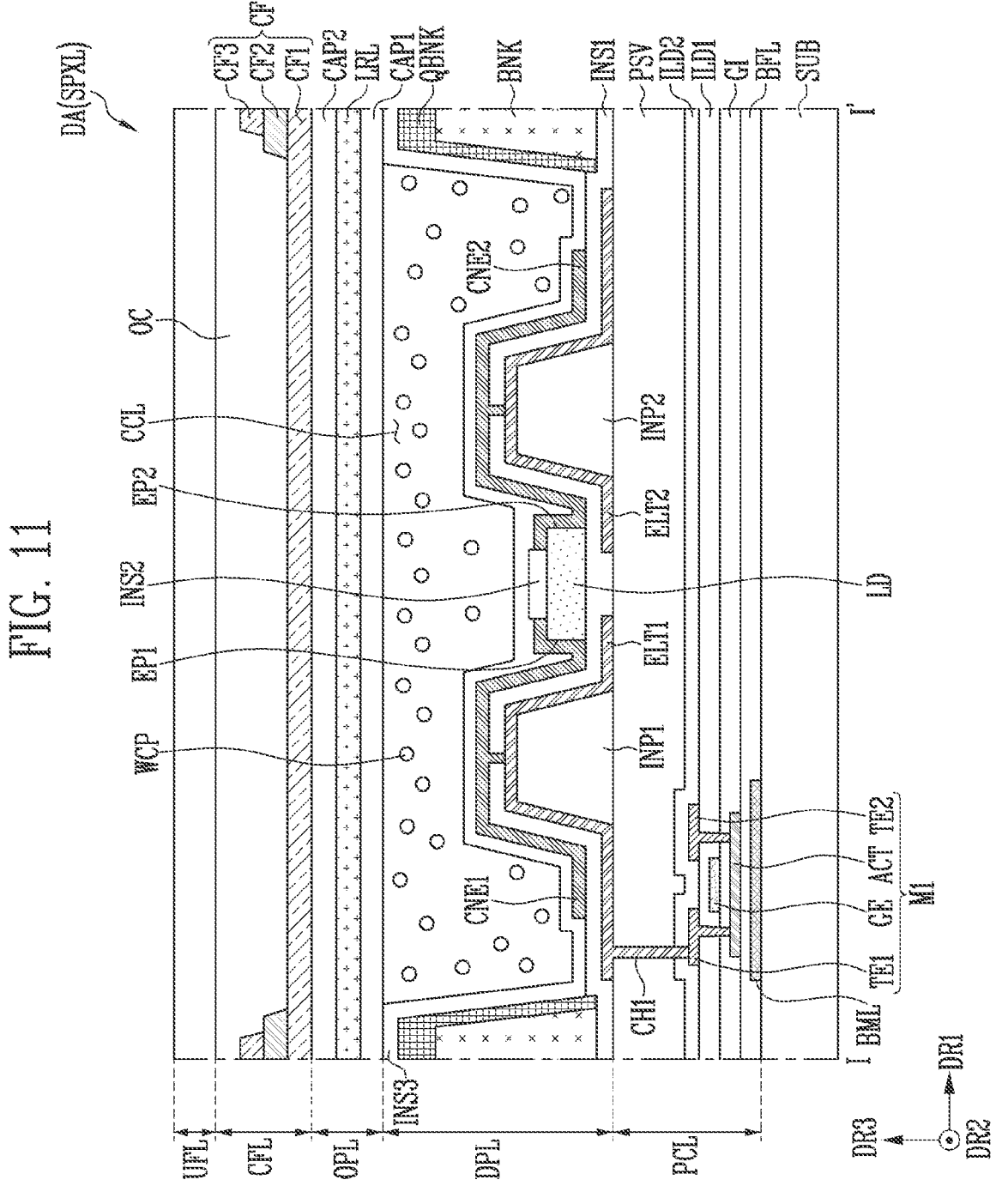
Figure 12:
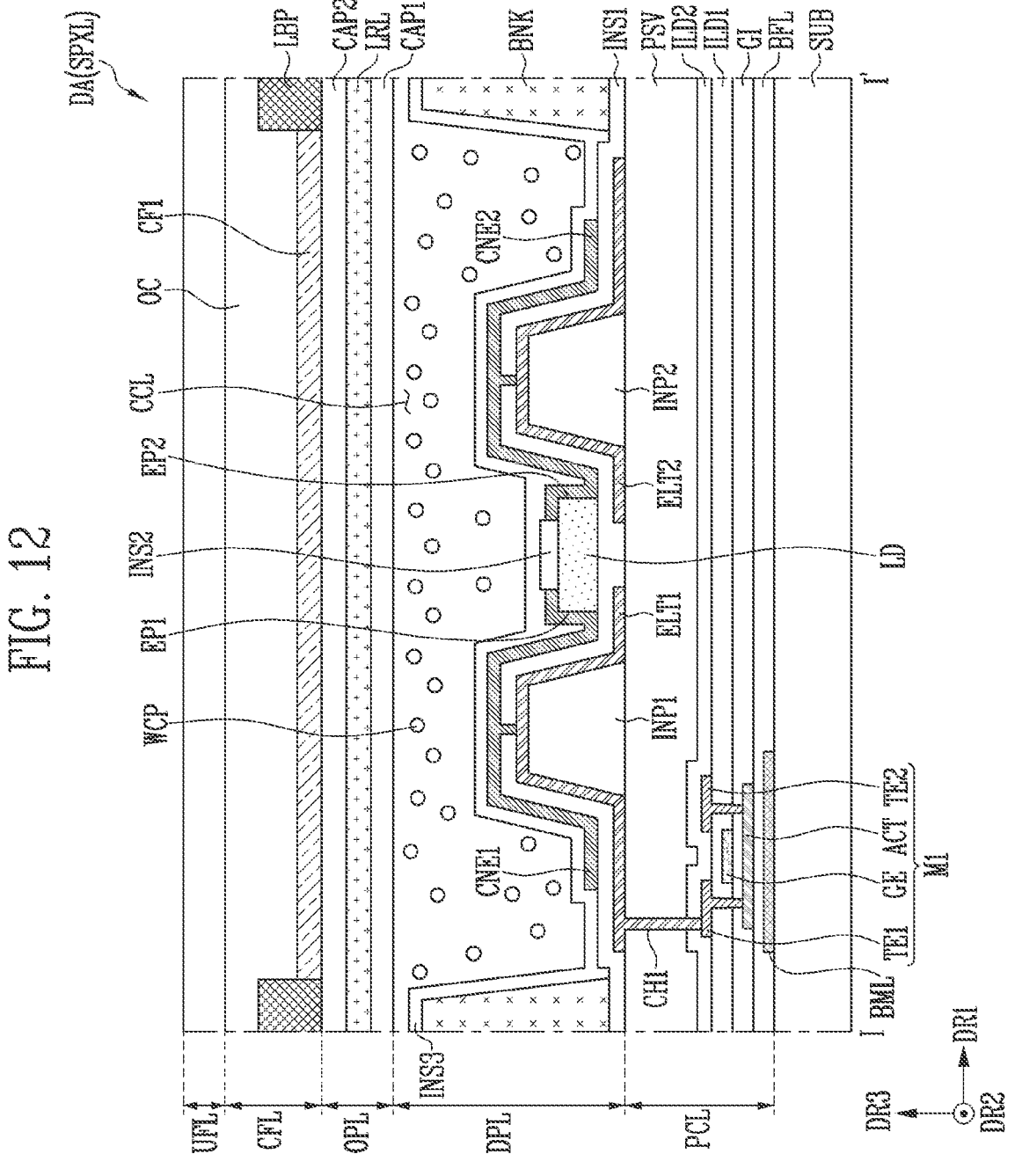

FIG. 9 may be a sectional view schematically illustrating a sub-pixel SPXL in accordance with a first embodiment of the present disclosure. FIG. 10 may be a sectional view schematically illustrating a sub-pixel SPXL in accordance with a second embodiment of the present disclosure. FIG. 11 may be a sectional view schematically illustrating a sub-pixel SPXL in accordance with a third embodiment of the present disclosure. FIG. 12 may be a sectional view schematically illustrating a sub-pixel SPXL in accordance with a fourth embodiment of the present disclosure.

First, referring to FIG. 9, a sub-pixel SPXL in accordance with one or more embodiments of the present disclosure will be described.

Referring to FIG. 9, the sub-pixel SPXL may include a substrate SUB, a pixel circuit layer PCL, a display element layer DPL, an optical layer OPL, a color filter layer CFL, and an outer film layer UFL.

The substrate SUB may form (or constitute) a base member of the sub-pixel SPXL. The substrate SUB may provide an area in which the pixel circuit layer PCL and the display element layer DPL can be disposed.

The pixel circuit layer PCL may be disposed on the substrate SUB. The pixel circuit layer PCL may include a lower auxiliary electrode BML, a buffer layer BFL, the first transistor M1, a gate insulating layer GI, a first interlayer insulating layer ILD1, a second interlayer insulating layer ILD2, a protective layer PSV, and a first contact hole CH1.

The lower auxiliary electrode BML may be disposed on the substrate SUB. The lower auxiliary electrode BML may serve as a path through which an electrical signal is moved. In one or more embodiments, a portion of the lower auxiliary electrode BML may overlap with the first transistor M1 in a thickness direction of the substrate SUB (e.g., a third direction DR3) in a plan view.

The buffer layer BFL may be disposed on the substrate SUB and the lower auxiliary electrode BML. The buffer layer BFL may cover the lower auxiliary electrode BML. The buffer layer BFL may prevent an impurity from being diffused from the outside. The buffer layer BFL may include one material from among silicon oxide ($SiO_x$), silicon nitride ($SiN_x$), silicon oxynitride ($SiO_xN_y$), aluminum oxide ($AlO_x$), and titanium oxide ($TiO_x$).

The first transistor M1 may be a thin film transistor (TFT). In accordance with one or more embodiments, the first transistor M1 may be a driving transistor. The first transistor M1 may be electrically connected to a light emitting element LD.

The first transistor M1 may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include one of poly-silicon, low temperature polycrystalline silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active pattern ACT. For example, the gate electrode GE may be disposed on the channel region of the active pattern ACT with the gate insulating layer GI interposed therebetween.

The gate insulating layer GI may be disposed on the active pattern ACT and the buffer layer BFL. The gate insulating layer GI may include one of silicon oxide ($SiO_x$), silicon nitride ($SiN_x$), silicon oxynitride ($SiO_xN_y$), aluminum oxide ($AlO_x$), and titanium oxide ($TiO_x$).

The first interlayer insulating layer ILD1 may be disposed on the gate electrode GE and the gate insulating layer GI. The first interlayer insulating layer ILD1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor electrode TE1 and the second transistor electrode TE2 may be disposed on the first interlayer insulating layer ILD1. The first transistor electrode TE1 may be in contact with the first contact region of the active pattern ACT while penetrating the gate insulating layer GI and the first interlayer insulating layer ILD1, and the second transistor electrode TE2 may be in contact with the second contact region of the active pattern ACT while penetrating the gate insulating layer GI and the first interlayer insulating layer ILD1. In an example, the first transistor electrode TE1 may be a drain electrode, and the second transistor electrode TE2 may be a source electrode. However, the present disclosure is not limited thereto.

The first transistor electrode TE1 may be electrically connected to a first electrode ELT1 through the first contact hole CH1 formed on the protective layer PSV and the second interlayer insulating layer ILD2.

The second interlayer insulating layer ILD2 may be disposed on the first transistor electrode TE1, the second transistor electrode TE2, and the first interlayer insulating layer ILD1. The second interlayer insulating layer ILD2 may include one of silicon oxide ($SiO_x$), silicon nitride ($SiN_x$), silicon oxynitride ($SiO_xN_y$), aluminum oxide ($AlO_x$), and titanium oxide ($TiO_x$).

The protective layer PSV may be disposed on the second interlayer insulating layer ILD2. The protective layer PSV may include an organic material and/or an inorganic material. The first contact hole CH1 may be formed in the protective layer PSV and the second interlayer insulating layer ILD2.

The display element layer DPL may be disposed on the pixel circuit layer PCL. The display element layer DPL may include a first insulating pattern INP1, a second insulating pattern INP2, the first electrode ELT1, a second electrode ELT2, a first insulating layer INS1, the light emitting element LD, a second insulating layer INS2, a first contact electrode CNE1, a second contact electrode CNE2, and a third insulating layer INS3.

The first insulating pattern INP1 and the second insulating pattern INP2 may be disposed on the protective layer PSV. The first insulating pattern INP1 and the second insulating pattern INP2 may have a shape protruding in the thickness direction of the substrate SUB (e.g., the third direction DR3). The first insulating pattern INP1 and the second insulating pattern INP2 may include an organic material and/or an inorganic material.

The first electrode ELT1 and the second electrode ELT2 may be disposed on the protective layer PSV. In accordance with one or more embodiments, at least a portion of the first electrode ELT1 may be arranged on the first insulating pattern INP1 and at least a portion of the second electrode ELT2 may be arranged on the second insulating pattern INP2, to each serve as a reflective partition wall.

The first electrode ELT1 may be electrically connected to the first transistor M1 through the first contact hole CH1.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. For example, the first electrode ELT1 and the second electrode ELT2 may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the present disclosure is not limited to the above-described example.

The first insulating layer INS1 may be disposed on the protective layer PSV, the first electrode ELT1, and the second electrode ELT2. The first insulating layer INS1 may cover the first electrode ELT1 and the second electrode ELT2. The first insulating layer INS1 may stabilize connection between electrode components, and reduce external influence. The first insulating layer INS1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The light emitting element LD may be disposed on the first insulating layer INS1 between the first electrode ELT1 and the second electrode ELT2. The light emitting element LD may emit light, based on an electrical signal provided from the first contact electrode CNE1 and the second contact electrode CNE2. In accordance with one or more embodiments, the light emitting element LD may emit light of a third color (e.g., blue). A color conversion layer CCL and the color filter layer CFL are provided in sub-pixels SPXL, so that a full-color image can be displayed. However, the present disclosure is not necessarily limited thereto, and light emitting elements LD emitting lights of different colors may be provided in each of the sub-pixels SPXL.

A portion of the second insulating layer INS2 may be disposed on the light emitting element LD. The second insulating layer INS2 may cover an active layer AL of the light emitting element LD. The second insulating layer INS2 may include an organic material or an inorganic material.

In accordance with one or more embodiments, the second insulating layer INS2 may expose at least a portion of the light emitting element LD. For example, the second insulating layer INS2 may not cover a first end portion EP1 and a second end portion EP2 of the light emitting element LD. Accordingly, the first end portion EP1 and the second end portion EP2 of the light emitting element LD may be exposed, and may be electrically connected respectively to the first contact electrode CNE1 and the second contact electrode CNE2.

The first contact electrode CNE1 and the second contact electrode CNE2 may be disposed on the first insulating layer INS1 over the first electrode ELT1 and the second electrode ELT2, respectively. In accordance with one or more embodiments, the first contact electrode CNE1 may be disposed on the first insulating layer INS1 and the second insulating layer INS2, and the second contact electrode CNE2 may be disposed on the first insulating layer INS1 and the second insulating layer INS2.

The first contact electrodes CNE1 may electrically connect the first electrode ELT1 and the light emitting element LD to each other, and the second contact electrode CNE2 may electrically connect the second electrode ELT2 and the light emitting element LD to each other.

The first contact electrode CNE1 and the second contact electrode CNE2 may include a conductive material. For example, the first contact electrode CNE1 and the second contact electrode CNE2 may include a transparent conductive material including one of Indium Tin Oxide (ITO), Indium Zinc Oxide (IZO), and Indium Tin Zinc Oxide (ITZO). However, the present disclosure is not necessarily limited to the above-described example.

In accordance with one or more embodiment, the first contact electrode CNE1 and the second contact electrode CNE2 may be patterned at the same time through the same process. Accordingly, the first contact electrode CNE1 and the second contact electrode CNE2 may include the same material.

The third insulating layer INS3 may be disposed on the light emitting element LD. The third insulating layer INS3 may be disposed on the first contact electrode CNE1, the second contact electrode CNE2, and the second insulating layer INS2. The third insulating layer INS3 may protect components of the display element layer DPL. The third insulating layer INS3 may include one material from among silicon oxide ($SiO_x$), silicon nitride ($SiN_x$), silicon oxynitride ($SiO_xN_y$), aluminum oxide ($AlO_x$), and titanium oxide ($TiO_x$).

In accordance with one or more embodiments, the display element layer DPL may further include a color conversion layer CCL. However, the present disclosure is not necessarily limited to the above-described example. In one or more embodiments, the color conversion layer CCL may be separately provided in a layer different from the display element layer DPL. The color conversion layer CCL may be disposed on the third insulating layer INS3.

The color conversion layer CCL may allow a wavelength of light provided from the light emitting element LD to be changed or transmitted therethrough.

For example, when the sub-pixel SPXL is a first sub-pixel SPXL1 emitting light of a first color (e.g., red), a wavelength conversion pattern WCP of the color conversion layer CCL may include first color conversion particles for converting light of the third color into light of the first color. The first color conversion particles may include a first quantum dot for converting light of blue color into light of red color. The first quantum dot may absorb blue light and emit red light by shifting a wavelength of the blue light according to energy transition.

In an example, when the sub-pixel SPXL is a second sub-pixel SPXL2 emitting light of a second color (e.g., green), the wavelength conversion pattern WCP of the color conversion layer CCL may include second color conversion particles for converting light of the third color into light of the second color. The second color conversion particles may include a second quantum dot for converting light of blue color into light of green color. The second quantum dot may absorb blue light and emit green light by shifting a wavelength of the blue light according to energy transition.

In one or more embodiments, the first quantum dot and the second quantum dot may have shape such as a spherical shape, a pyramid shape, a multi-arm shape, a cubic nano particle, a nano wire, a nano fabric, or a nano plate particle. However, the present disclosure is not necessarily limited thereto, and the shape of the first quantum dot and the second quantum dot may be variously changed.

In one or more embodiments, when the sub-pixel SPXL is a third sub-pixel SPXL3 emitting light of the third color (e.g., blue), the color conversion layer CCL may include a light transmission pattern. The light transmission pattern is used to efficiently use light emitted from the light emitting element LD, and may include a plurality of light scattering particles dispersed in a suitable matrix material (e.g., a predetermined matrix material) such as base resin. For example, the light transmission pattern may include light scattering particles such as silica, but the material constituting the light scattering particles is not limited thereto.

The optical layer OPL may be disposed on the display element layer DPL. In accordance with one or more embodiments, the optical layer OPL may include a first capping layer CAP1, a low refractive layer LRL, and a second capping layer CAP2.

The first capping layer CAP1 may seal (or cover) the color conversion layer CCL. The first capping layer CAP1 may be disposed between the low refractive layer LRL and the display element layer DPL. The first capping layer CAP1 may be provided throughout the sub-pixels SPXL. The first capping layer CAP1 may prevent the color conversion layer CCL from being damaged or contaminated due to infiltration of an impurity such as moisture or air from the outside.

In accordance with one or more embodiments, the first capping layer CAP1 may include one of silicon nitride ($SiN_x$), silicon oxide ($SiO_x$), silicon oxynitride ($SiO_xN_y$), and aluminum oxide ($AlO_x$).

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the sub-pixels SPXL.

The low refractive layer LRL may recycle light provided from the color conversion layer CCL, thereby improving light efficiency. To this end, the low refractive layer LRL may have a refractive index lower than a refractive index of the color conversion layer CCL.

In accordance with one or more embodiments, the low refractive layer LRL may include a base resin and hollow particles dispersed in the base resin. The hollow particle may include a hollow silica particle. Alternatively, the hollow particle may be a pore formed by porogen, but the present disclosure is not necessarily limited thereto. Also, the low refractive layer LRL may include one of a zinc oxide ($ZnO_x$) particle, a titanium dioxide ($TiO_x$) particle, and a nano silicate particle, but the present disclosure is not necessarily limited thereto.

The second capping layer CAP2 may be disposed on the low refractive layer LRL. The second capping layer CAP2 may be disposed between the color filter layer CFL and the low refractive layer LRL. The second capping layer CAP2 may be provided throughout the sub-pixels SPXL. The second capping layer CAP2 may prevent the low refractive layer LRL from being damaged or contaminated due to infiltration of an impurity such as moisture or air from the outside.

In accordance with one or more embodiments, the second capping layer CAP2 may include one of silicon nitride ($SiN_x$), silicon oxide ($SiO_x$), silicon oxynitride ($SiO_xN_y$), and aluminum oxide ($AlO_x$).

The color filter layer CFL may be disposed on the second capping layer CAP2. The color filter layer CFL may be provided throughout the sub-pixels SPXL. The color filter layer CFL may include color filters CF1, CF2, and CF3, and an overcoat layer OC.

The color filters CF1, CF2, and CF3 may be provided on the second capping layer CAP2.

In accordance with one or more embodiments, when the sub-pixel SPXL is the first sub-pixel SPXL1 emitting light of the first color, an emission area in which light of the light emitting element LD is emitted may overlap with a first color filter CF1 and may not overlap with a second color filter CF2 and a third color filter CF3, in a plan view. An embodiment in which the sub-pixel SPXL is the first sub-pixel SPXL1 is illustrated in FIG. 9.

In accordance with one or more embodiments, when the sub-pixel SPXL is the second sub-pixel SPXL2 emitting light of the second color, the emission area in which light of the light emitting element LD is emitted may overlap with the second color filter CF2 and may not overlap with the first color filter CF1 and the third color filter CF3, in a plan view.

In accordance with one or more embodiments, when the sub-pixel SPXL is the third sub-pixel SPXL3 emitting light of the third color, the emission area in which light of the light emitting element LD is emitted may overlap with the third color filter CF3 and may not overlap with the first color filter CF1 and the second color filter CF2, in a plan view.

The first color filter CF1 allows light of the first color to be transmitted therethrough, and may not allow light of the second color and light of the third color to be transmitted therethrough. In an example, the first color filter CF1 may include a colorant of the first color.

The second color filter CF2 allows light of the second color to be transmitted therethrough, and may not allow light of the first color and light of the third color to be transmitted therethrough. In an example, the second color filter CF2 may include a colorant of the second color.

The third color filter CF3 allows light of the third color to be transmitted therethrough, and may not allow light of the first color and light of the second color to be transmitted therethrough. In an example, the third color filter CF3 may include a colorant of the third color.

The overcoat layer OC may be disposed on the color filters CF1, CF2, and CF3. The overcoat layer OC may be provided throughout the sub-pixels SPXL. The overcoat layer OC may cover a lower member including the color filters CF1, CF2, and CF3. The overcoat layer OC may prevent moisture or air from infiltrating into the above-described lower member. Also, the overcoat layer OC may protect the above-described lower member from a foreign matter such as dust.

In accordance with one or more embodiments, the overcoat layer OC may include an organic material such as acryl resin, epoxy resin, phenolic resin, polyamide resin, polyimide resin, unsaturated polyester resin, poly-phenylene ether resin, poly-phenylene sulfide resin, or benzocyclobutene (BCB). However, the present disclosure is not necessarily limited to the above-described example.

The outer film layer UFL may be disposed on the color filter layer CFL. The outer film layer UFL may be disposed at an outer portion of the display device DD, to reduce external influence. The outer film layer UFL may be provided throughout the sub-pixels SPXL. In one or more embodiments, the outer film layer UFL may include one of a polyethylenephthalate (PET) film, a low reflective film, a polarizing film, and a transmittance controllable film, but the present disclosure is not necessarily limited thereto.

Next, the sub-pixel SPXL in accordance with the second embodiment of the present disclosure will be described with reference to FIG. 10. In FIG. 10, portions overlapping with those described above will be omitted, and portions different from the first embodiment of the present disclosure, which is described above with reference to FIG. 9, will be discussed.

Referring to FIG. 10, the sub-pixel SPXL in accordance with the second embodiment of the present disclosure is different from the sub-pixel SPXL in accordance with the first embodiment of the present disclosure, which is described above with reference to FIG. 9, in that the first contact electrode CNE1 and the second contact electrode CNE2 are patterned at different times, and the third insulating layer INS3 is disposed between the first contact electrode CNE1 and the second contact electrode CNE2.

The first contact electrode CNE1 and the second contact electrode CNE2 may be formed through different processes. The first contact electrode CNE1 and the second contact electrode CNE2 may be patterned at different times.

A portion of the third insulating layer INS3 may be disposed on the first contact electrode CNE1, and a portion of the third insulating layer INS3 may be disposed between the first contact electrode CNE1 and the second contact electrode CNE2. The third insulating layer INS3 may prevent a short circuit between the first contact electrode CNE1 and the second contact electrode CNE2.

A fourth insulating layer INS4 may be disposed on the first contact electrode CNE1, the second contact electrode CNE2, and the third insulating layer INS3. The fourth insulating layer INS4 may protect components of the display element layer DPL. The fourth insulating layer INS4 may include one of silicon oxide ($SiO_x$), silicon nitride ($SiN_x$), silicon oxynitride ($SiO_xN_y$), aluminum oxide ($AlO_x$), and titanium oxide ($TiO_x$).

Next, the sub-pixel SPXL in accordance with the third embodiment of the present disclosure will be described with reference to FIG. 11. In FIG. 11, portions overlapping with those described above will be omitted, and portions different from the first embodiment of the present disclosure, which is described above with reference to FIG. 9, will be discussed.

Referring to FIG. 11. The sub-pixel SPXL in accordance with the third embodiment of the present disclosure is different from the sub-pixel SPXL in accordance with the first embodiment of the present disclosure, which is described above with reference to FIG. 9, in that the sub-pixel SPXL in accordance with the third embodiment of the present disclosure further includes an additional bank QBNK. In accordance with one or more embodiments, the additional bank QBNK may be designated as a bank for the color conversion layer.

The additional bank QBNK may be disposed on a bank BNK. The additional bank QBNK may overlap with the bank BNK in the third direction DR3 in a plan view. The additional bank QBNK may define an area in which the color conversion layer CCL is disposed. In accordance with one or more embodiments, the additional bank QBNK may have a shape protruding the thickness direction of the substrate SUB (e.g., the third direction DR3). For example, the additional bank QBNK may be formed to be around (e.g., to surround) the color conversion layer CCL in a plan view. The additional bank QBNK may be formed before the color conversion layer CCL is provided, and then the color conversion layer CCL may be patterned in the area defined by the additional bank QBNK.

In accordance with one or more embodiments, the additional bank QBNK may include an organic material or an inorganic material. In one or more embodiments, the additional bank QBNK may include a light blocking material or a reflective material, thereby recycling light. The additional bank QBNK can improve the light emission efficiency of the color conversion layer CCL.

Next, the sub-pixel SPXL in accordance with the fourth embodiment of the present disclosure will be described with reference to FIG. 12. In FIG. 12, portions overlapping with those described above will be omitted, and portions different from the first embodiment of the present disclosure, which is described above with reference to FIG. 9, will be discussed.

Referring to FIG. 12, the sub-pixel SPXL in accordance with the fourth embodiment of the present disclosure is different from the sub-pixel SPXL in accordance with the first embodiment of the present disclosure, which is described above with reference to FIG. 9, in that the sub-pixel SPXL in accordance with the fourth embodiment of the present disclosure further includes a light blocking pattern LBP.

The light blocking pattern LBP may be disposed on the second capping layer CAP2 while being adjacent to the color filter CF. For example, the light blocking pattern LBP may be disposed adjacent to the first color filter CF1. In accordance with one or more embodiments, the light blocking pattern LBP may overlap with the bank BNK in a plan view. The light blocking pattern LBP may include a light blocking material, to prevent a light leakage defect in which light is leaked between adjacent sub-pixels SPXL and to prevent color mixture of lights respectively emitted from adjacent sub-pixels SPXL. For example, the light blocking pattern LBP may include a black matrix.

An embodiment in which the sub-pixel SPXL is the first sub-pixel SPXL1 providing the first color is illustrated in FIG. 12. Accordingly, a structure in which the first color filter CF1 is disposed while being adjacent to the light blocking pattern LBP is illustrated in FIG. 12. In one or more embodiments, when the sub-pixel SPXL is the second sub-pixel SPXL2, the second color filter CF2 may be disposed. When the sub-pixel SPXL is the third sub-pixel SPXL3, the third color filter CF3 may be disposed.

Hereinafter, a manufacturing method for the display device DD and a panel PNL for manufacturing the display device DD in accordance with one or more embodiments of the present disclosure will be described with reference to FIGS. 13 to 26. In FIGS. 13 to 26, descriptions of portions overlapping with those described above will be simplified or omitted.

FIGS. 13 to 26 illustrate an embodiment in which, after light emitting panels 110 are formed on a mother substrate 100, the light emitting panels 110 are individually separated from each other through a cutting process.

Figure 13:
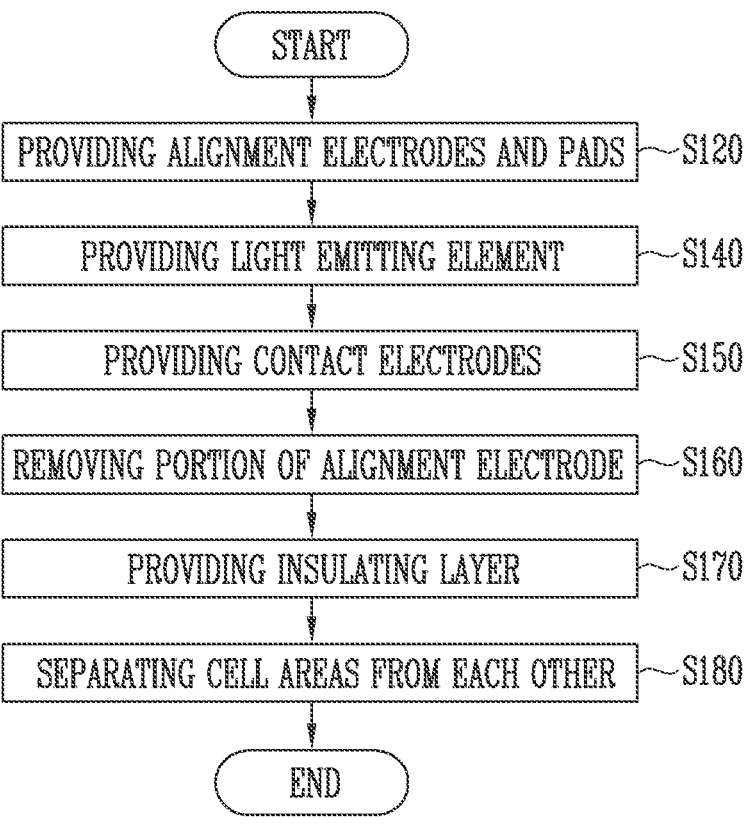
FIG. 13 is a flowchart illustrating a manufacturing method for the display device in accordance with one or more embodiments of the present disclosure.

FIG. 13 is a flowchart illustrating a manufacturing method for the display device in accordance with one or more embodiments of the present disclosure.

FIGS. 14, 16, 18, 20, 21, and 23 to 26 are schematic process sectional views illustrating a manufacturing method for the display device in accordance with one or more embodiments of the present disclosure. FIGS. 14, 16, 18, 20, 21, and 23 to 26 illustrate a planar structure of the light emitting panels 110.

FIGS. 15, 17, 19, and 22 are schematic process sectional views illustrating a manufacturing method for the display device in accordance with one or more embodiments of the present disclosure. FIGS. 15, 17, 19, and 22 illustrate a sectional structure in an individual light emitting panel 110. FIGS. 15, 17, 19, and 22 illustrate a structure corresponding to the schematic section taken along the line I-I' of FIG. 8, which is described above with reference to FIGS. 9 and 10.

Figure 23:
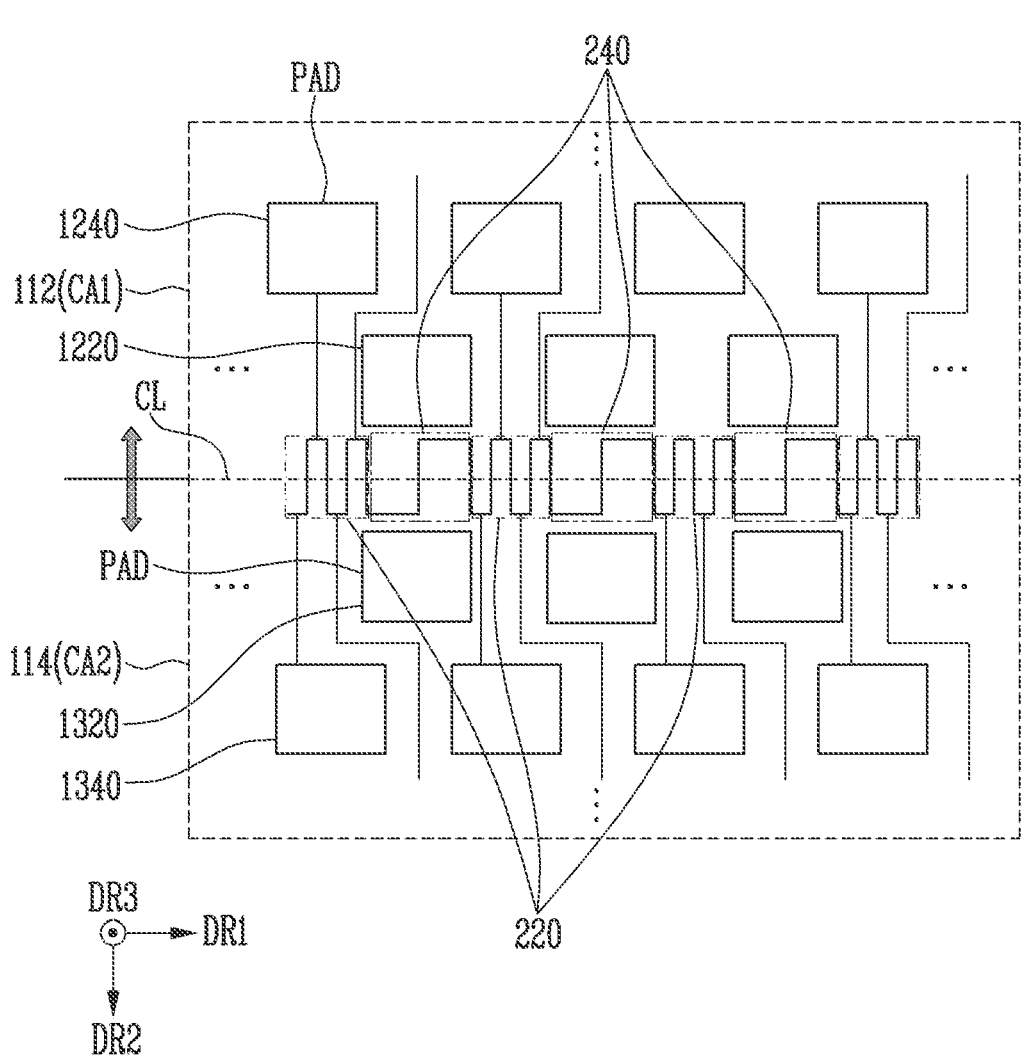
Figure 24:
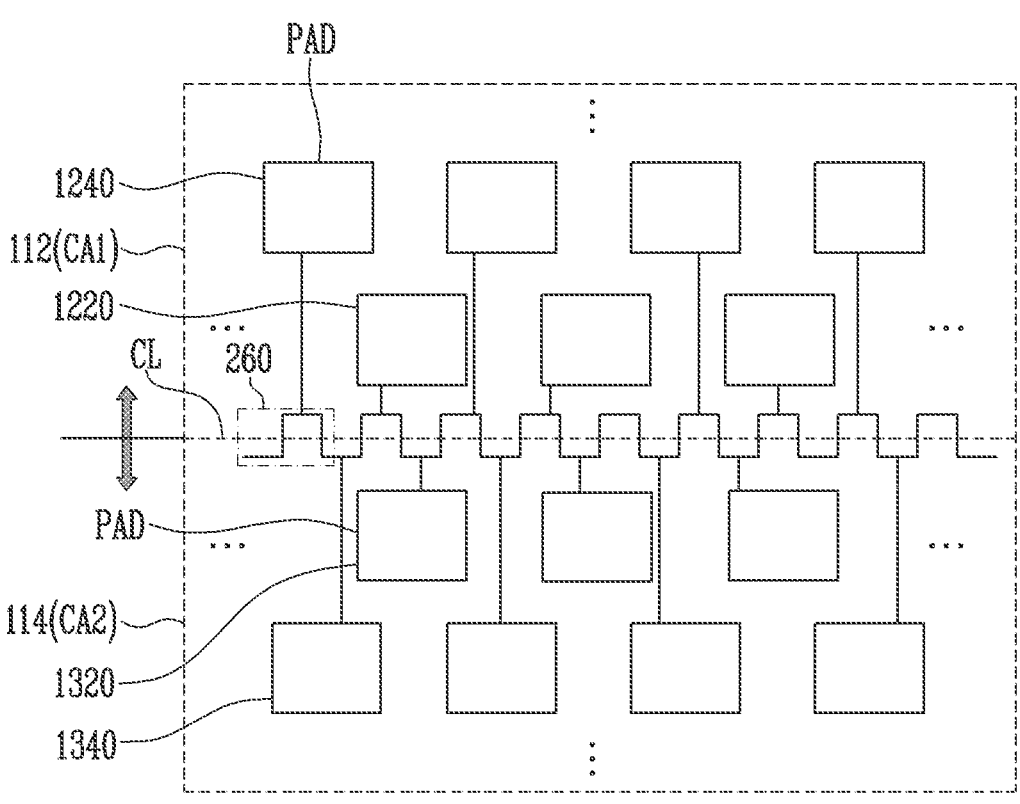
Figure 24:
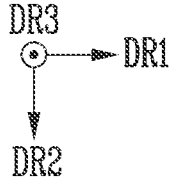
Figure 25:
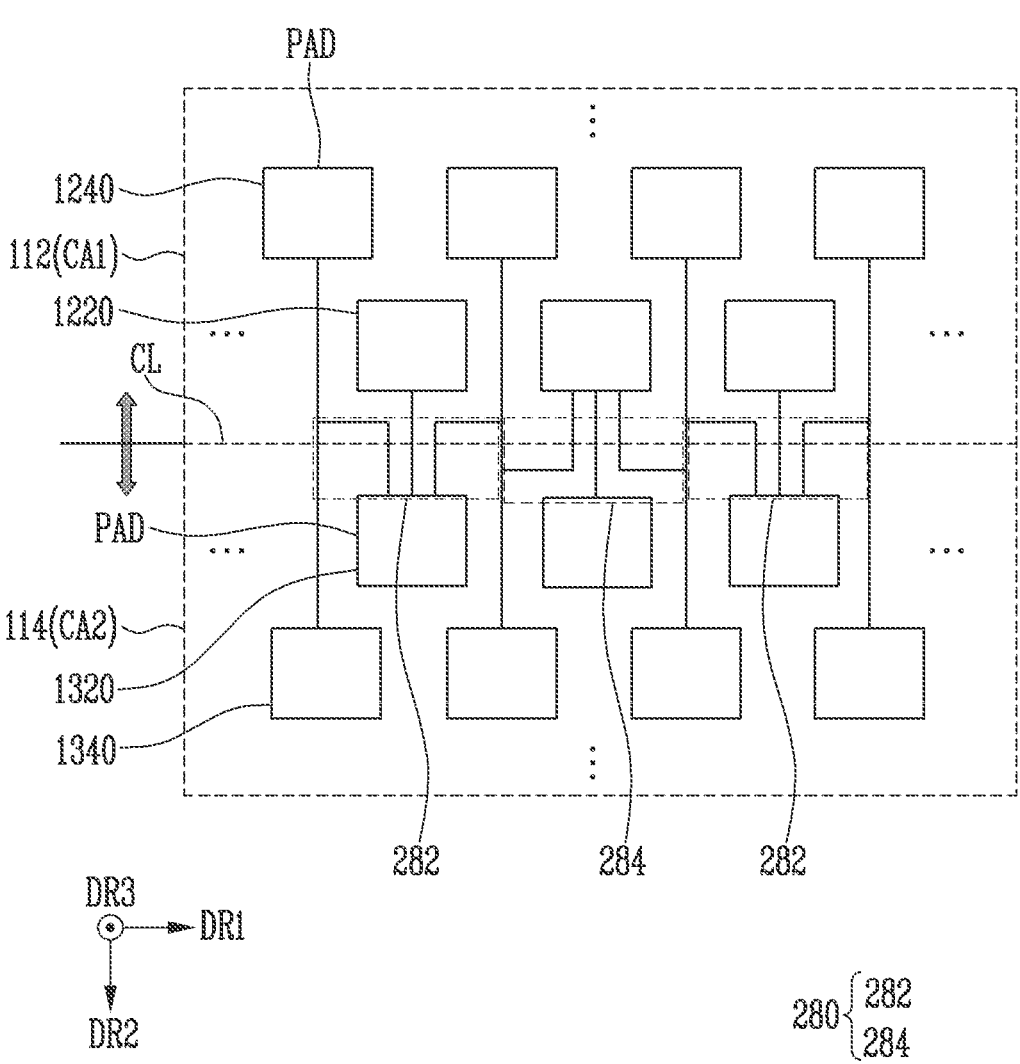

FIGS. 23 to 25 are schematic enlarged views illustrating an area adjacent to cell areas CA in accordance with one or more embodiments. FIGS. 23 to 25 illustrate a structure of a cell connection line 200 formed in an area in which the light emitting panels 110 are adjacent to each other.

Figure 26:
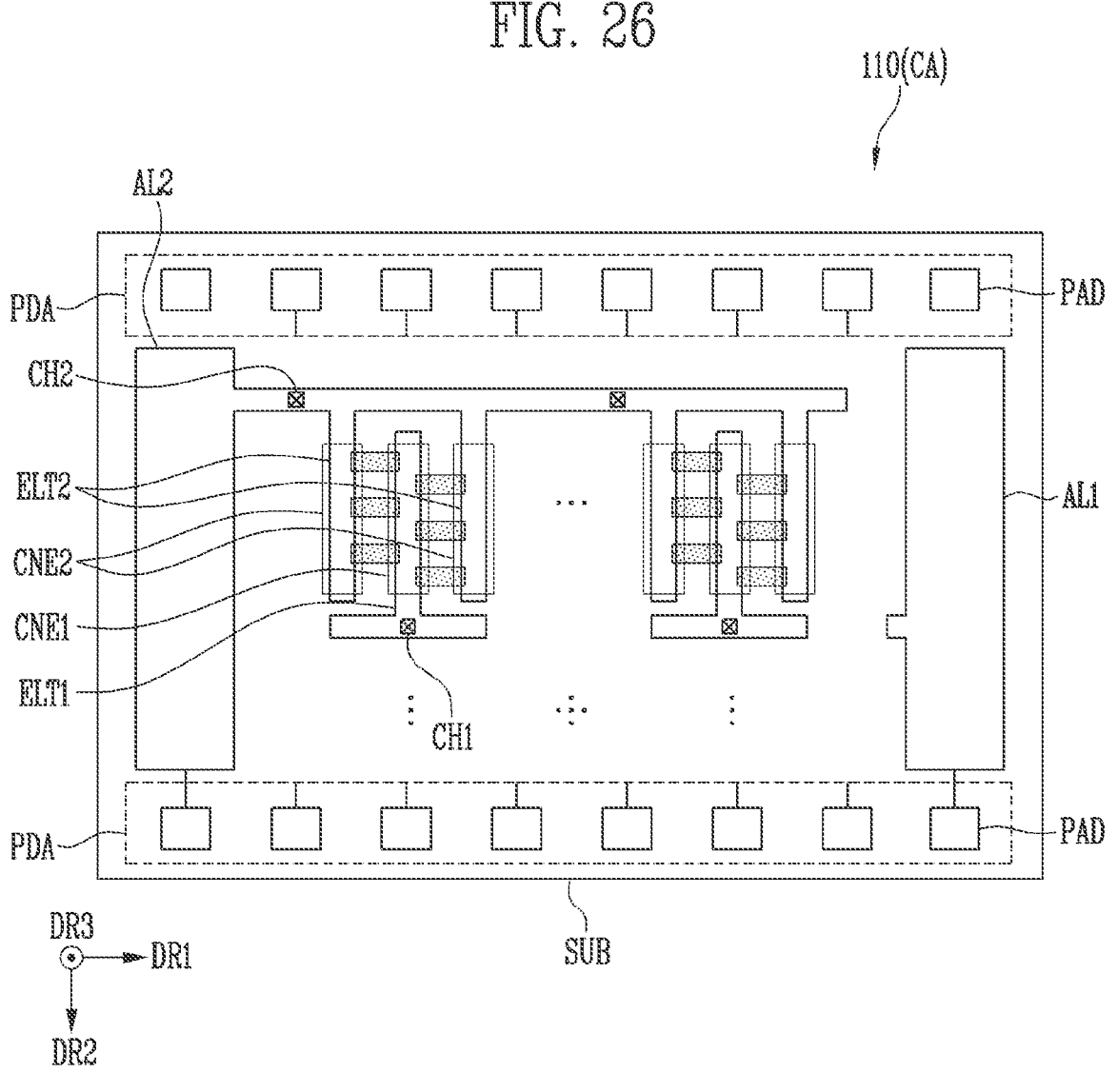

FIG. 26 is a plan view schematically illustrating one of separated cell areas CA in accordance with one or more embodiments of the present disclosure. FIG. 26 illustrates a planar structure of a light emitting panel 110 after a cutting process is performed.

Referring to FIG. 13, the manufacturing method for the display device DD in accordance with the embodiment of the present disclosure may include step S120 of providing alignment electrodes and pads, step S140 of providing a light emitting element, step S150 of providing contact electrodes, step S160 of removing a portion of the alignment electrode, step S170 of providing an insulating layer, and step S180 of separating cell areas from each other.

Figure 14:
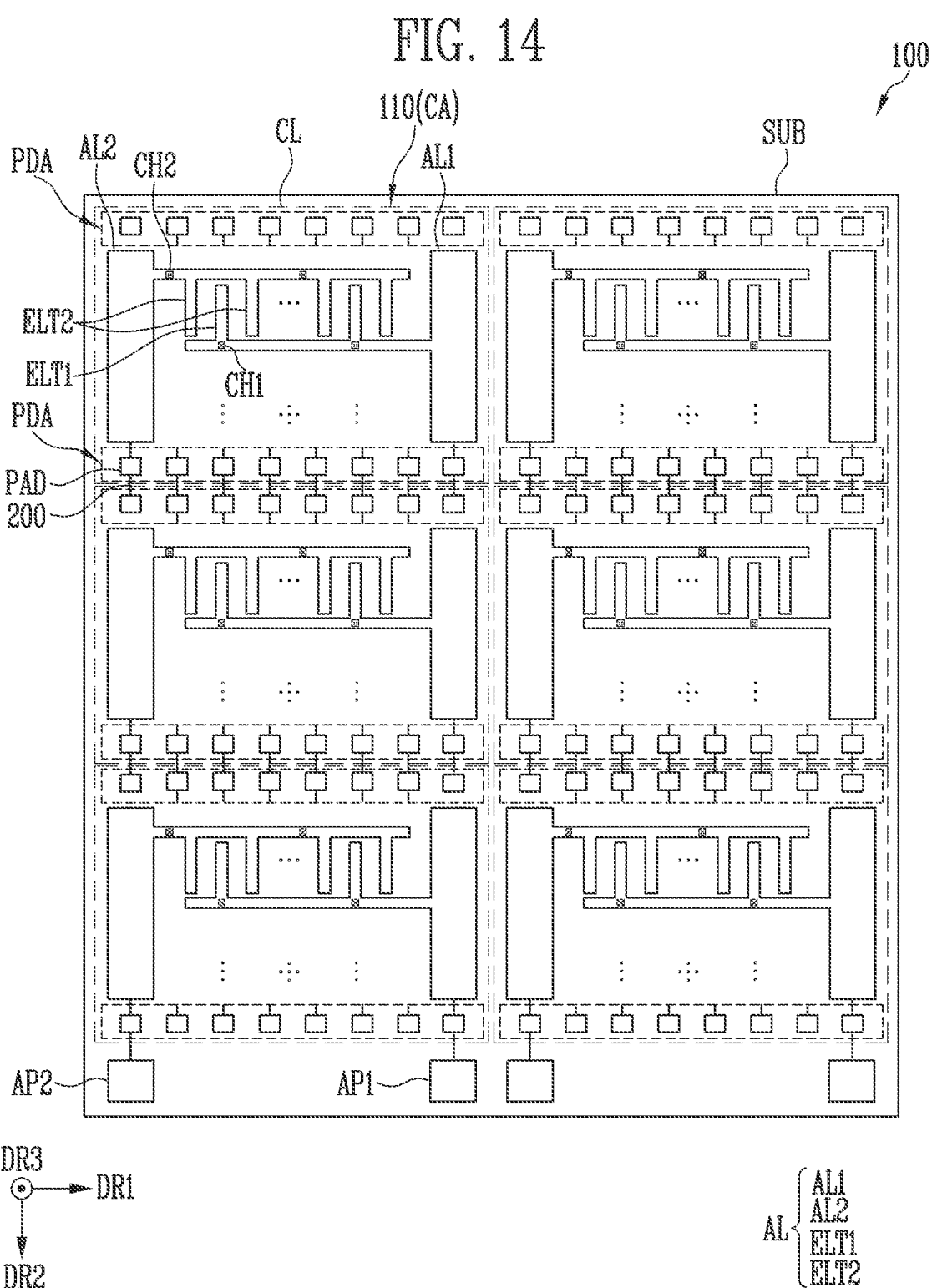
FIGS. 14, 16, 18, 20, 21, and 23 to 26 are schematic process sectional views illustrating a manufacturing method for the display device in accordance with one or more embodiments of the present disclosure.
Figure 15:
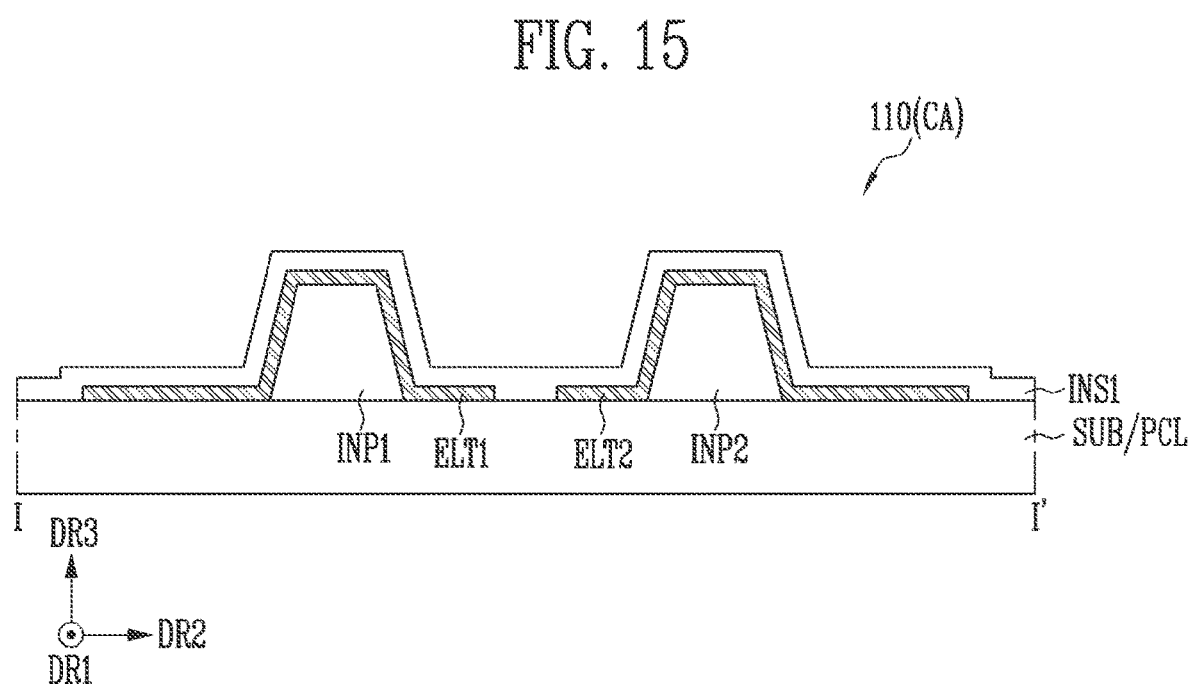

Referring to FIGS. 13, 14, and 15, in the step S120 of providing the alignment electrodes and the pads, alignment electrodes AL, a first alignment pad AP1, a second alignment pad AP2, and pads PAD may be disposed on a substrate SUB of the mother substrate 100. The alignment electrodes AL may include a first alignment line AL1, a second alignment line AL2, a first electrode ELT1, and a second electrode ELT2. According to one or more embodiments, the mother substrate 100 may be mother glass substrate.

The mother substrate 100 may include the substrate SUB. The mother substrate 100 is used to concurrently (e.g., simultaneously) manufacture light emitting panels 110 on one large-sized substrate SUB. To this end, the mother substrate 100 may include a substrate SUB forming a base surface, and electrodes, lines, and insulating layers, which are disposed on the substrate SUB.

The mother substrate 100 may be designated as a panel for manufacturing display devices.

The substrate SUB may include cell areas CA for forming the light emitting panels 110. Each of individual light emitting panels 110 to be manufactured may correspond to one of the cell areas CA. The light emitting panels 110 may be disposed on the substrate SUB, to be defined respectively corresponding to the cell areas CA.

Each of the cell areas CA is an area in which each of the individual light emitting panels 110 is formed, and be defined (or partitioned) by a cutting line CL on which a cutting process is performed.

The first alignment line AL1, the first electrode ELT1, and the second electrode ELT2 may be formed (or disposed) on the substrate SUB of each of the cell areas CA. The cell connection line 200 may be formed (or disposed) on the substrate SUB between adjacent cell areas CA. The cell connection line 200 may electrically connect adjacent light emitting panels 110 to each other. In one or more embodiments, the cell connection line 200 may be disposed in (or at) the same layer as a conductive layer disposed in a pixel circuit layer PCL or one of the alignment electrodes AL, but the present disclosure is not necessarily limited to a specific example.

In accordance with one or more embodiments, the pixel circuit layer PCL that may be defined in each of the cell areas CA may be disposed on the substrate SUB, and the first electrode ELT1 and the second electrode ELT2 may be disposed on the pixel circuit layer PCL. Also, in one or more embodiments, a first insulating pattern INP1 and a second insulating pattern INP2 may be disposed (e.g., formed or patterned) before the first electrode ELT1 and the second electrode ELT2 are disposed, and a first insulating layer INS1 may be disposed on the first electrode ELT1 and the second electrode ELT2. In one or more embodiments, a portion of the first electrode ELT1 may be disposed on the first insulating pattern INP1, and a portion of the second electrode ELT2 may be disposed on the second insulating pattern INP2.

In one or more embodiments, the first electrode ELT1 may be electrically connected to the first alignment line AL1, and the second electrode ELT2 may be electrically connected to the second alignment line AL2.

In one or more embodiments, before the step S140 of providing the light emitting element, first electrodes ELT1 formed in each of the cell areas CA may be commonly connected to the first alignment line AL1, and second electrodes ELT2 formed in each of the cell areas CA may be commonly connected to the second alignment line AL2.

In each of the cell areas CA, the first alignment line AU may be disposed adjacent to one side of the cell area CA, and the second alignment line AL2 may be adjacent to the other side of the cell area CA. In one or more embodiments, the first alignment line AU may be electrically commonly connected to the first electrodes ELT1 formed in the cell area CA, and the second alignment line AL2 may be electrically commonly connected to the second electrodes ELT2 formed in the cell area CA.

The first alignment line AL1 may be electrically connected to a first alignment pad AP1 disposed in one area (e.g., an edge area) of the mother substrate 100, and the second alignment line AL2 may be electrically connected to a second alignment pad AP2 disposed in one area (e.g., an edge area) of the mother substrate 100.

A first alignment line AL1 of one of the light emitting panels 110 may be electrically connected to a first alignment line AL1 of an adjacent light emitting panel 110, and a second alignment line AL2 of one of the light emitting panels 110 may be electrically connected to a second alignment line AL2 of an adjacent light emitting panel 110. For example, first alignment lines AU disposed on each column may be electrically connected to each other through a cell connection line 200 and pads PAD, and may be electrically connected to the first alignment pad AP1. Second alignment lines AL2 disposed on each column may be electrically connected to each other through a cell connection line 200 and pads PAD, and may be electrically connected to the second alignment pad AP2.

In one or more embodiments, the first alignment line AL1 and the second alignment line AL2 may have a single-layer structure or a multi-layer structure. For example, the first alignment line AL1 and the second alignment line AL2 may be patterned through the same process. Alternatively, in another example, portions of the first alignment line AL1 and the second alignment line AL2 may be patterned with the first electrode ELT1 and the second electrode ELT2 through the same process, and other portions of the first alignment line AL1 and the second alignment line AL2 may be patterned through different processes.

Figure 16:
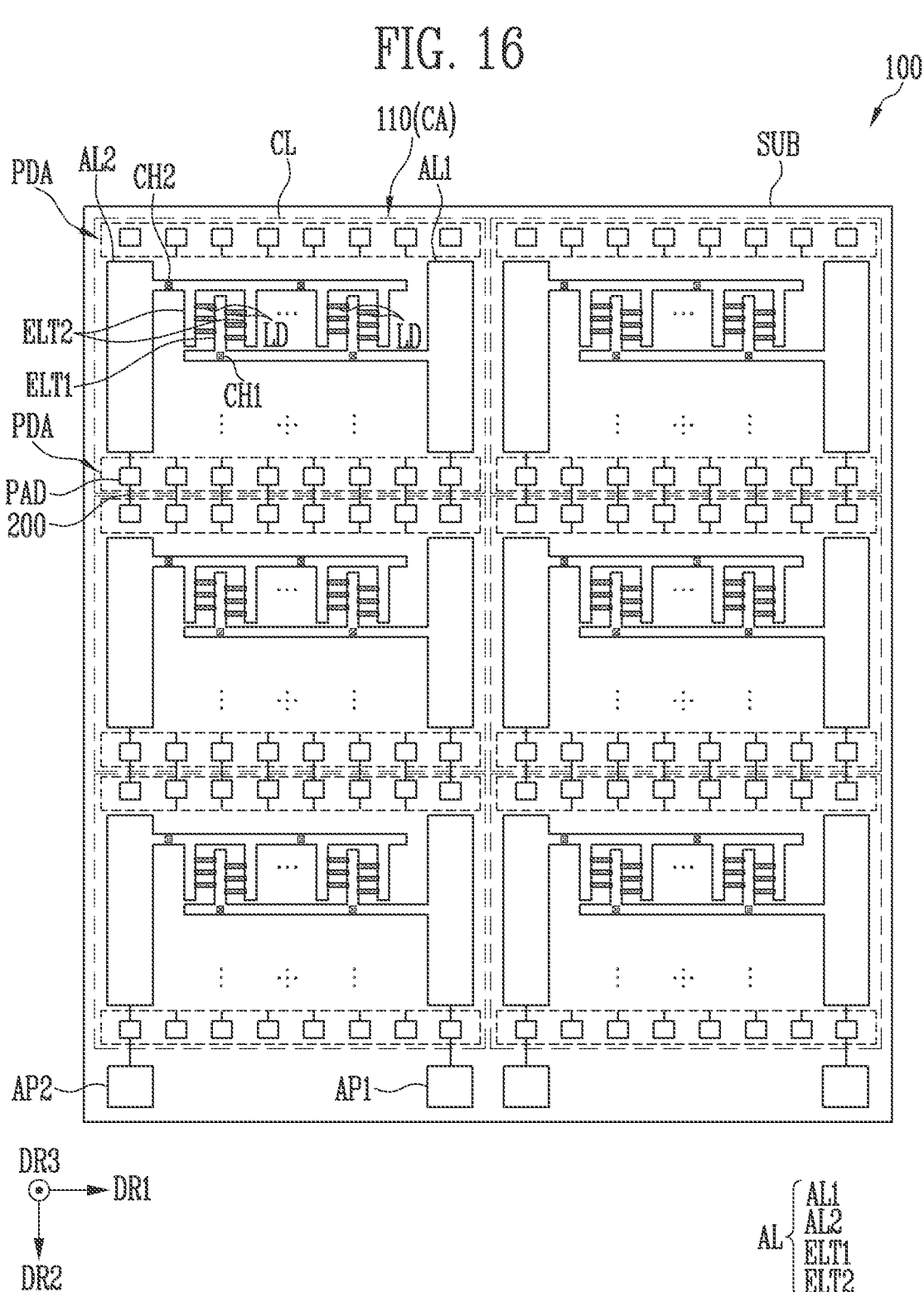
Figure 17:
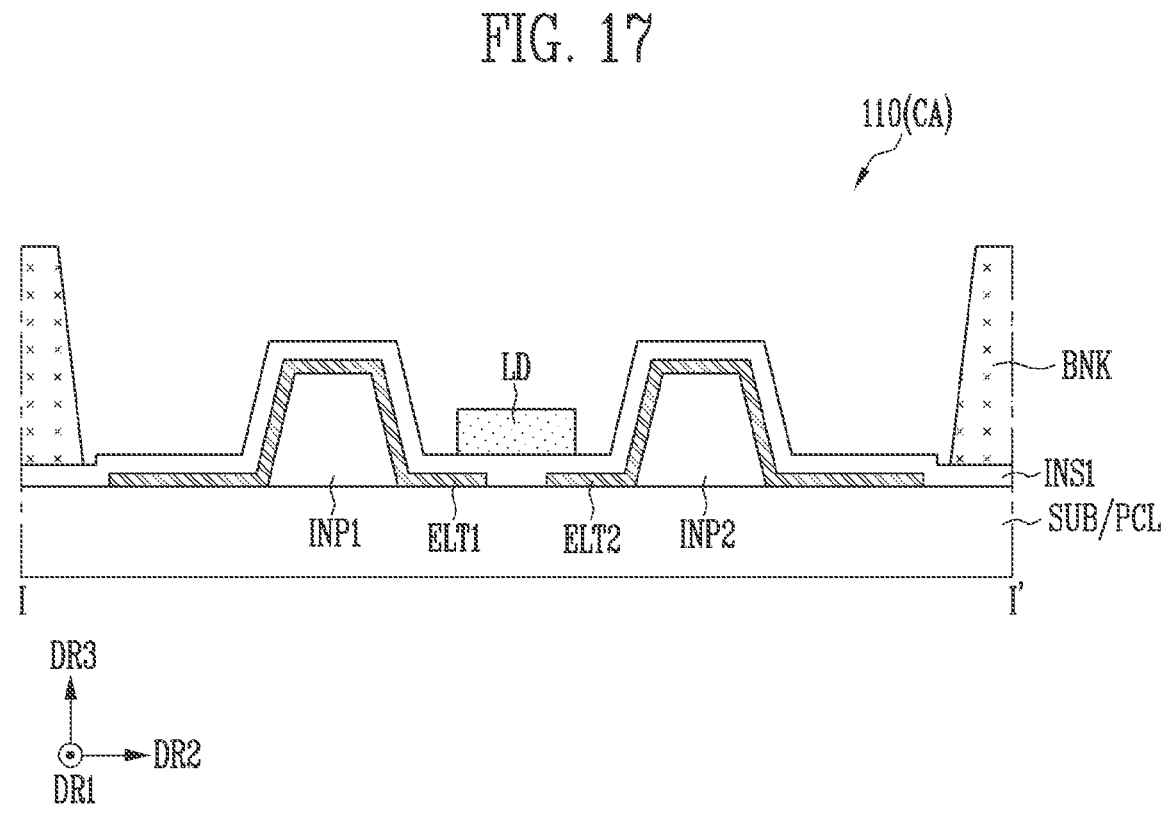

Referring to FIGS. 13, 16, and 17, in the step S140 of providing the light emitting element, a light emitting element LD may be provided (or disposed) in the light emitting panel 110. For example, the light emitting element LD may be disposed on the first insulating layer INS1 between the first electrode ELT1 and the second electrode ELT2.

In this step, a voltage may be applied to the first alignment pad AP1 and the second alignment pad AP2, thereby forming an electric field in an area in which the light emitting element LD is to be disposed. In addition, light emitting elements LD may be provided (or supplied) to each of the cell areas CA, thereby aligning the provided light emitting elements LD, based on the formed electric field. For example, because an AC voltage is provided to the first alignment pad AP1, the AC voltage may be provided to the first alignment line AL1 and the first electrode ELT1. Because a ground voltage is provided to the second alignment pad AP2, the ground voltage may be provided to the second alignment line AL2 and the second electrode ELT2. Accordingly, an electric field is formed between the first electrode ELT1 and the second electrode ELT2, so that the light emitting elements LD may be arranged based on the formed electric field.

In accordance with one or more embodiments, the light emitting elements LD may be dispersed in a suitable solvent (e.g., a predetermined solvent), to be provided (or supplied) to the cell area CA through an inkjet process. However, the method for supplying the light emitting elements LD is not limited thereto, and the light emitting elements LD may be supplied through various processes including a slit coating process and the like.

In one or more embodiments, before the light emitting element LD is provided, a bank BNK may be disposed on the first insulating layer INS1. The bank BNK may be formed in a shape surrounding the area in which the light emitting element LD is to be disposed. When the light emitting element LD is supplied through the inkjet process, the bank BNK may form a space in which the solvent can be accommodated.

Figure 18:
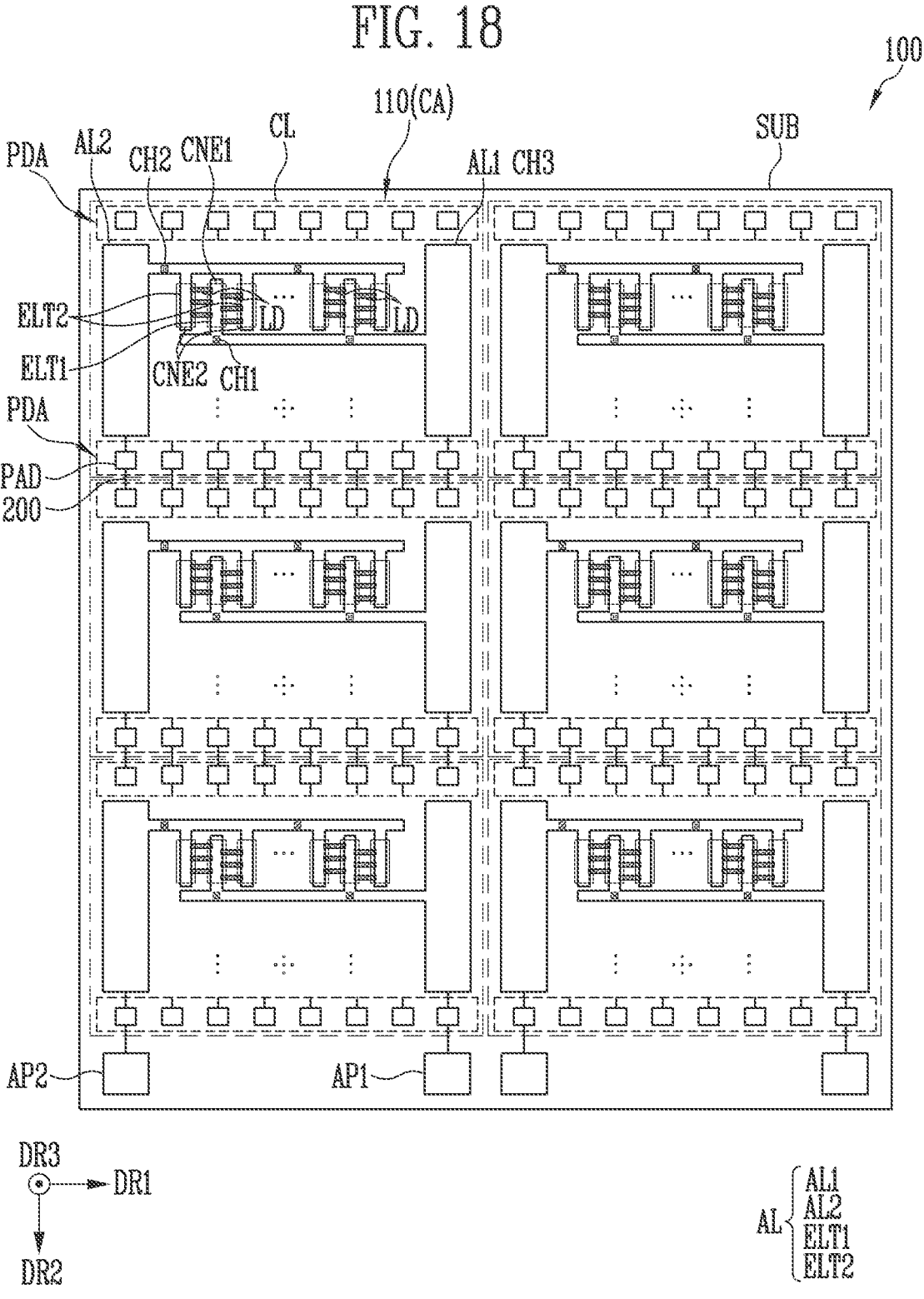
Figure 19:
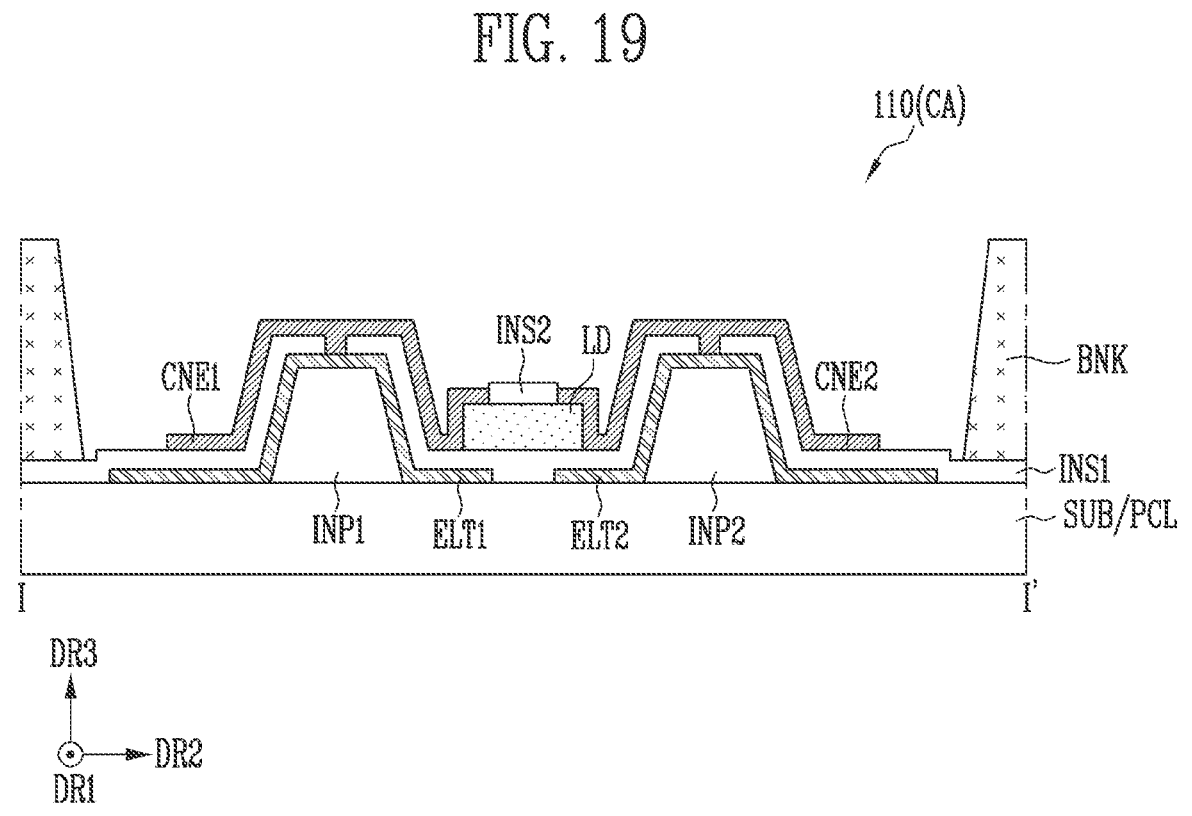

Referring to FIGS. 13, 18, and 19, in the step S150 of providing the contact electrodes, contact electrodes CNE1 and CNE2 may be formed in the cell area CA. For example, the first contact electrode CNE1 may be formed to overlap with the first electrode ELT1 in a plan view and to be electrically connected to the light emitting element LD. The second contact electrode CNE2 may be formed to overlap with the second electrode ELT2 in a plan view and to be electrically connected to the light emitting element LD.

In accordance with one or more embodiments, before the contact electrodes CNE1 and CNE2 are formed, a second insulating layer INS2 may be disposed on the light emitting element LD. The second insulating layer INS2 may be disposed to overlap with an active layer AL of the light emitting element LD in a plan view.

In one or more embodiments, the first contact electrode CNE1 and the second contact electrode CNE2 may be patterned through different processes. After the second insulating layer INS2 is formed, the first contact electrode CNE1 and the second contact electrode CNE2 may be sequentially provided.

Figure 20:
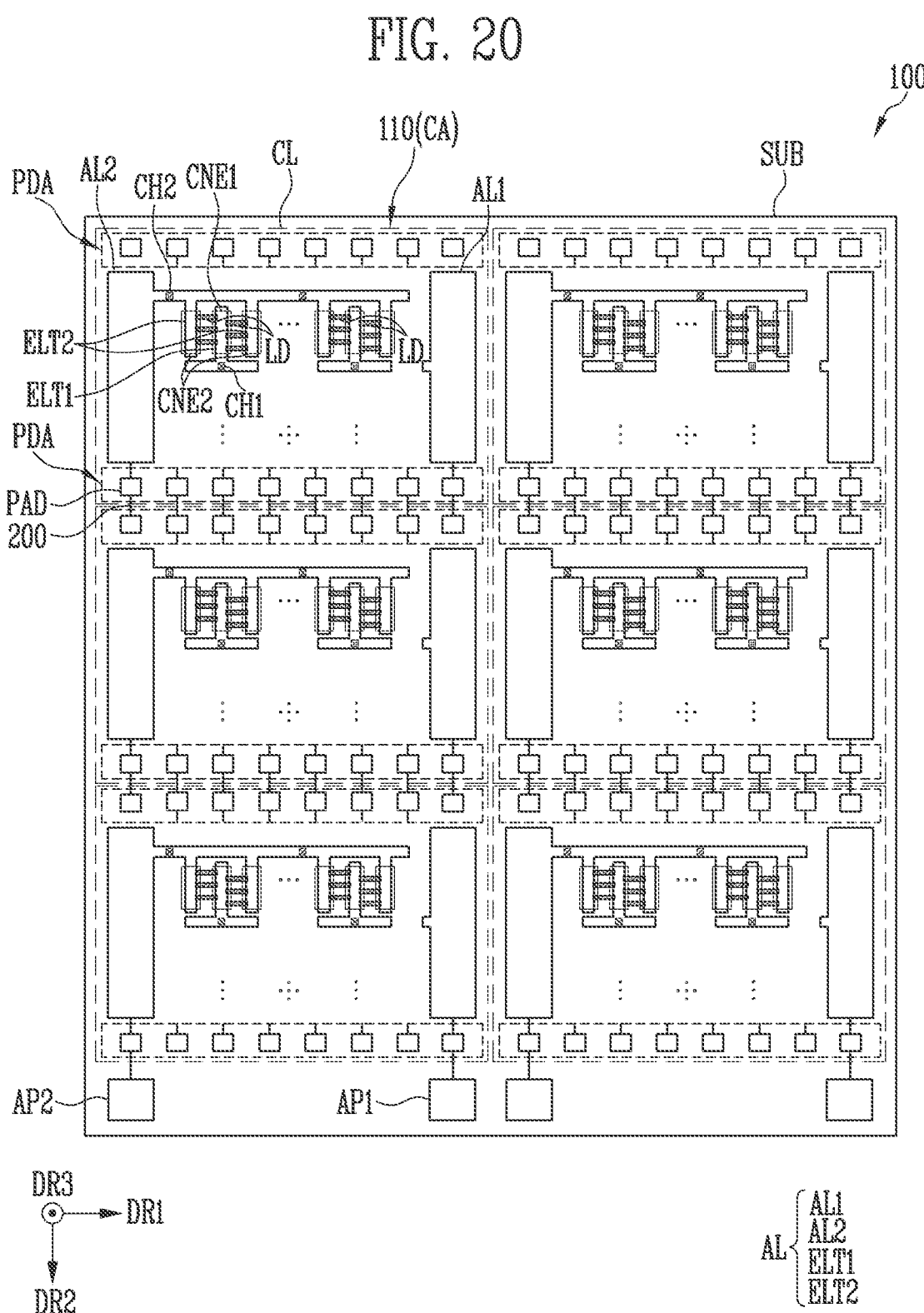
Figure 21:
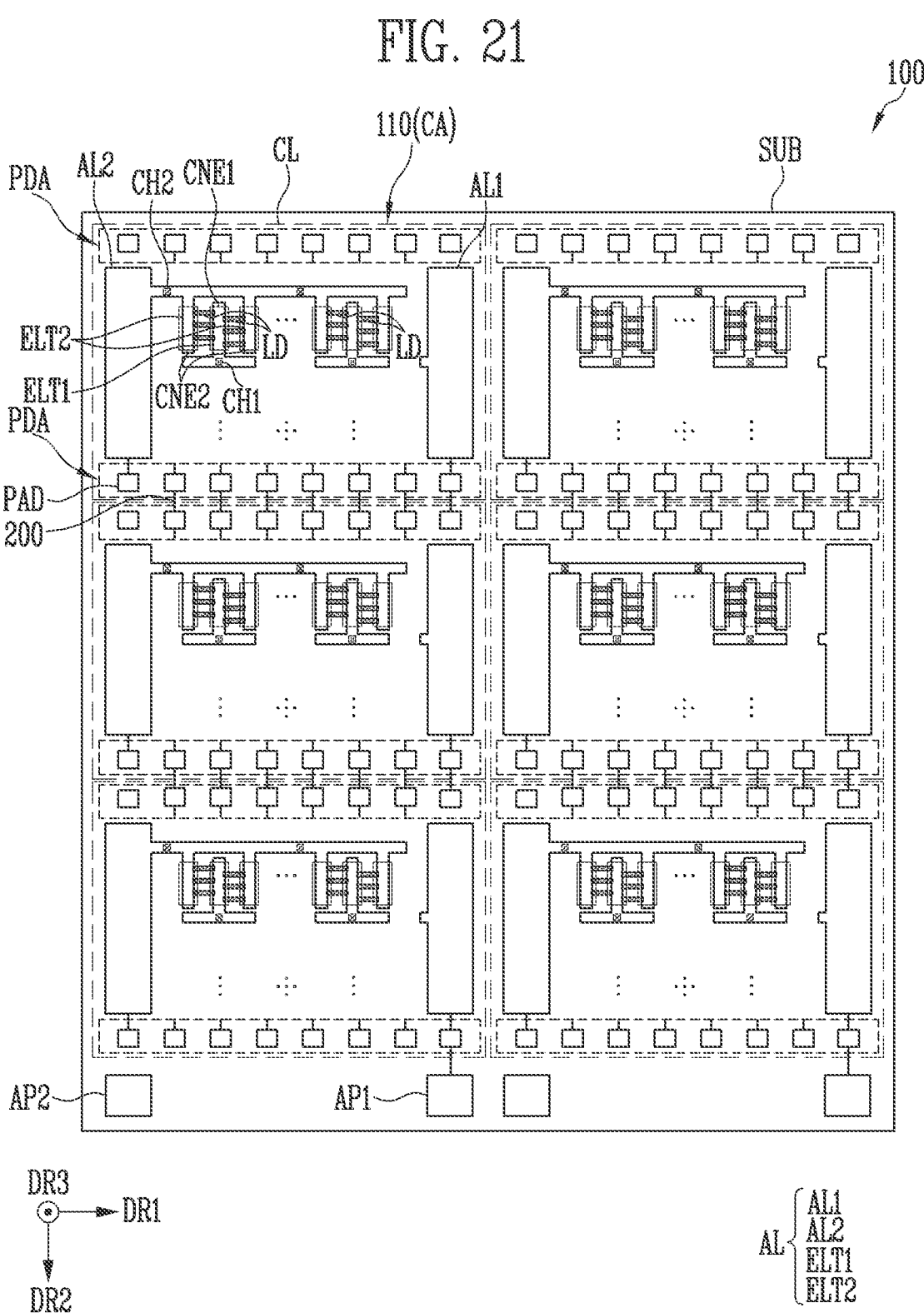

Referring to FIGS. 13, 20, and 21, in the step S160 of removing the portion of the alignment electrode, at least a portion of the alignment electrodes AL may be removed.

In accordance with one or more embodiments, the first electrode ELT1 and/or the second electrode ELT2 may be separated from each other by etching a portion of the alignment electrodes AL such that sub-pixels SPXL of each light emitting panel 110 are individually driven. For example, a first electrode ELT1 of each sub-pixel SPXL may be electrically connected to a pixel circuit of each sub-pixel SPXL, and connection between first electrodes ELT1 may be cut off, so that the first electrode ELT1 and the pixel circuit are separated for each sub-pixel SPXL.

In accordance with one or more embodiments, in this step, at least some of lines connecting adjacent light emitting panels 110 to each other may be maintained such that influence caused by static electricity on each light emitting panel 110 is reduced. In relation to this, a line connection structure in accordance with a first embodiment is illustrated in FIG. 20, and a line connection structure in accordance with a second embodiment is illustrated in FIG. 21.

First, referring to FIG. 20, in this step, cell connection lines 200 electrically connecting adjacent light emitting panels 110 to each other may not be removed. As described above, in one or more embodiments, an etching process for removing at least a portion of the alignment electrodes AL may be performed. At least one of the cell connection lines 200 electrically connecting between the adjacent light emitting panels 110 may not be separately etched.

For example, before the step 160 of removing the portion of the alignment electrode, each of first alignment lines AU and second alignment lines AL2, which are disposed in different cell areas CA, may be electrically connected to each other by a cell connection line 200. In accordance with one or more embodiments, when a portion of the alignment electrodes AL is etched, the cell connection line 200 may not be cut off (or etched). When the step S160 of removing the portion of the alignment electrode is performed, a cell connection line 200 electrically connected to the first alignment line AU and a cell connection line 200 electrically connected to the second alignment line AL2 may not be cut off (or etched).

That is, in accordance with one or more embodiments, the adjacent light emitting panels 110 may be electrically connected by the cell connection line 200, even when the step S160 of removing the portion of the alignment electrode is performed.

In accordance with one or more embodiments, the cell connection line 200 may be cut off through a cutting process which is subsequently performed. That is, until a time at which a process of allowing the light emitting panels 110 to be physically separated from each other is performed, at least some of electrodes of a plurality of cell areas CA may be electrically connected to each other. When static electricity occurs in any one of the cell areas CA, the static electricity may be distributed to the whole of the mother substrate 100. Accordingly, damage of an individual component of the light emitting panels 110, particularly the light emitting element LD, due to the static electricity can be reduced or prevented.

Next, referring to FIG. 21, at least some of lines electrically connecting adjacent light emitting panels 110 to each other are removed, but at least other some of the lines may be maintained.

For example, first alignment lines AL1 disposed in different cell areas CA may be electrically connected to each other by a cell connection line 200, but a cell connection line 200 that has electrically connected second alignment lines AL2 disposed in different cell areas CA may be cut off by the etching process for removing at least a portion of the alignment electrodes AL. For example, when a portion of the alignment electrodes AL is etched, a portion of the cell connection line 200 connected to the first alignment line AL1 is not cut off (or etched), but a portion of the cell connection line 200 connected to the second alignment line AL2 may be cut off (or etched).

Like this embodiment, until a time at which a process of allowing the light emitting panels 110 to be physically separated from each other is performed, at least some of electrodes of a plurality of cell areas CA may be electrically connected to each other, so that influence caused by static electricity on the light emitting panel 110 can be reduced.

Figure 22:
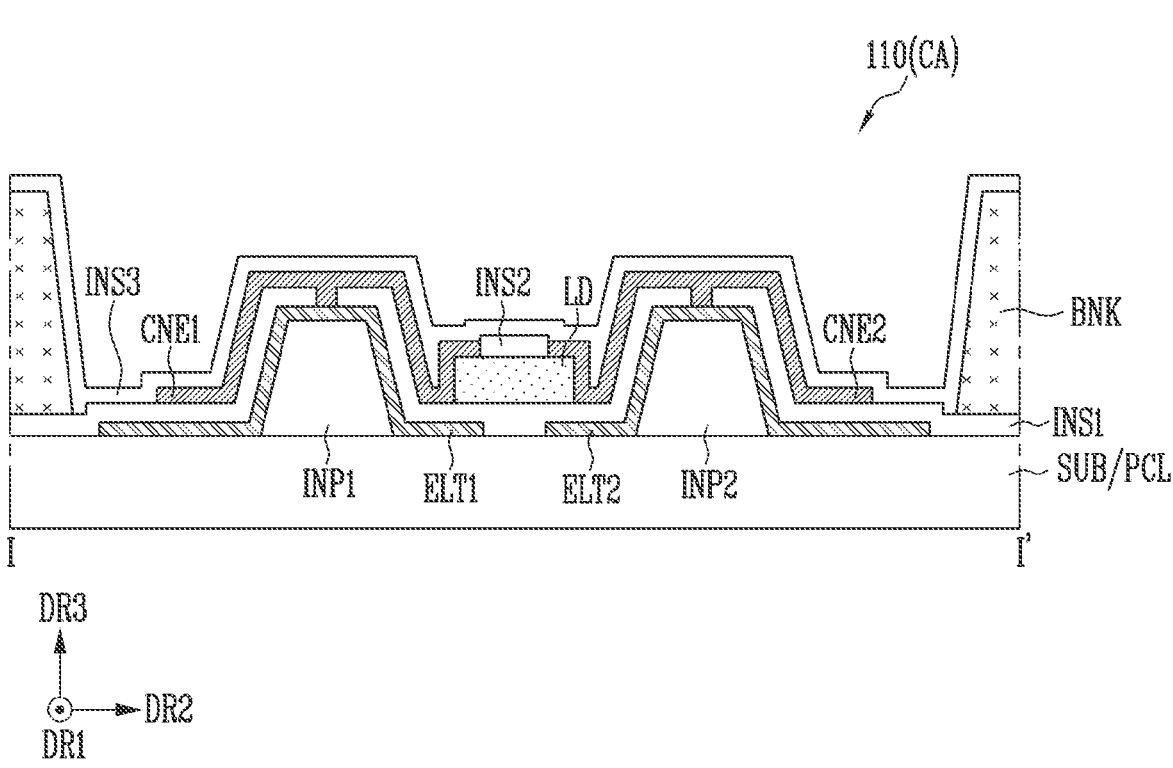

Referring to FIGS. 13 and 22, in the step S170 of providing the insulating layer, an insulating layer may be provided on the contact electrodes CNE1 and CNE2. The insulating layer INS3 provided in this step may be patterned in each of the cell areas CA.

In accordance with one or more embodiments, the insulating layer provided in this step may be one of insulating layers disposed on the light emitting element LD. The insulating layer provided in this step may be one of insulating layers provided after the first contact electrode CNE1 and/or the second contact electrode CNE2 are/is formed. For example, the insulating layer provided in this step may be the above-described third insulating layer INS3. The third insulating layer INS3 may be patterned in each of the cell areas CA.

The third insulating layer INS3 may be deposited to cover an individual component of a display element layer DPL. The third insulating layer INS3 may be patterned in each of the cell areas CA. The third insulating layer INS3 may be disposed on the first contact electrode CNE1, the second contact electrode CNE2, and the second insulating layer INS2.

The step S170 of providing the insulating layer may be performed under a structure in which at least a portion of the cell connection line 200 is disposed between adjacent cell areas CA. The step S170 of providing the insulating layer may be performed in a state in which at least a portion of the cell connection line 200 is disposed. The step S170 of providing the insulating layer may be performed before the step S180 of separating the cell areas from each other. In particular, the step S170 of providing the insulating layer may be performed before step of cutting off the cell connection lines 200, which is accompanied in the step S180 of separating the cell areas from each other.

As described above, when the cell connection line 200 remains, static electricity occurring in the light emitting panel 110 may be distributed to the whole of the mother substrate 100, so that damage of the display element layer DPL, particularly, the light emitting element LD can be prevented. In addition, because the step S170 of providing the insulating layer is performed before the step of cutting off the cell connection lines 200, the insulating layer (e.g., the third insulating layer INS3) can be provided without any damage of the light emitting element LD. Moreover, experimentally, when the insulating layer is formed in a state in which the light emitting element LD is damaged, electrodes are abnormally connected to the light emitting element LD, and therefore, the light emission efficiency of light emitting elements LD may be deteriorated. However, in accordance with one or more embodiments, the step S170 of providing the insulating layer may be provided in a state in which there is provided a structure in which static electricity is efficiently distributed, and then the cell connection line 200 may be cut off. Thus, the light emitting element LD can be prevented from being abnormally operated, and accordingly, the light emission efficiency of a pixel PXL can be improved.

Referring to FIGS. 13 and 23 to 25, in the step S180 of separating the cell areas from each other, adjacent cell areas CA may be separated from each other, so that light emitting panels 110 are individually provided.

Each of FIGS. 23 to 25 mainly illustrates a structure of a cell connection line 200 provided in cell areas CA adjacent to each other. For example, each of FIGS. 23 to 25 may be a schematic enlarged view illustrating a cell connection line 200 electrically connecting light emitting panels 110 adjacent to each other in the second direction DR2.

In FIGS. 23 to 25, for convenience of description, a light emitting panel 110 of a cell area CA disposed at one side is designated as a first light emitting panel 112 of a first cell area CA1, and a light emitting panel 110 of a cell area CS disposed at an opposite side is designated as a second light emitting panel 114 of a second cell area CA2. The first light emitting panel 112 and the second light emitting panel 114 may be distinguished from each other by a cutting line CL extending in a direction (e.g., a predetermined direction, e.g., the first direction DR1).

In the step S180 of separating the cell areas from each other, a process for cutting off the substrate SUB may be performed. For example, a scribing process may be performed to separate the cell areas CA to each other by cutting off the substrate SUB of the mother substrate 100. However, the present disclosure is not necessarily limited to the above-described example, and various processes for cutting off the substrate and electrode lines may be applied in this step.

In accordance with one or more embodiments, the first light emitting panel 112 and the second light emitting panel 114 may be physically separated from each other with respect to the cutting line CL. For example, a substrate SUB corresponding to the first light emitting panel 112 and a substrate SUB corresponding to the second light emitting panel 114 may be separated from each other by performing a cutting process with respect to the cutting line CL.

In accordance with one or more embodiments, a cell connection line 200 may be cut off, so that light emitting panels 110 of each of adjacent cell areas CA are not electrically connected to each other. For example, the cell connection line 200 may be cut off in the first direction DR1, so that the first light emitting panel 112 and the second light emitting panel 114, which are adjacent to each other in the second direction DR2, are electrically separated from each other.

That is, before the step S180 of separating the cell areas from each other is performed, the cell connection line 200 that has electrically connected the light emitting panels 110 adjacent to each other may be cut off in this step. Accordingly, light emitting panels 110 in which an individual electrical path is defined can be provided.

In accordance with one or more embodiments, in the step S180 of separating the cell areas from each other, a process of cutting off the cell connection line 200 and a process of cutting off the substrate SUB may be concurrently (e.g., simultaneously) performed. The process of cutting off the cell connection line 200 and a process of separating the cell areas CA from each other may be concurrently (e.g., simultaneously) performed. For example, the first light emitting panel 112 and the second light emitting panel 114 may be electrically separated from each other through a single process of cutting off the cell connection line 200.

In one cutting process, the substrate SUB and the cell connection line 200 may be concurrently (e.g., simultaneously) cut off. A process for cutting the cell connection line 200 can be simplified. Accordingly, process performance can be improved, and process cost can be saved.

In accordance with one or more embodiments, the cell connection line 200 may include a suitable structure (e.g., a predetermined structure), so that electrical connection between adjacent light emitting panels 110 can be separated. At the same time, electrical connection between components included in at least one of the light emitting panels 110 can be separated.

For example, the cell connection line 200 may be formed as a suitable pattern (e.g., a predetermined pattern), so that electrical connection between the first light emitting panel 112 and the second light emitting panel 114 can be separated. At the same time, electrical connection between some components in the first light emitting panel 112 can be separated. This will be described later with reference to FIGS. 23 to 25.

First, a structure of a cell connection line 200 in accordance with an embodiment of the present disclosure will be described with reference to FIG. 23.

The cell connection line 200 may include a first cell connection pattern 220 and a second cell connection pattern 240. In FIG. 23, for convenience of description, the first cell connection pattern 220 is indicated by an alternated long and short dash line, and the cell connection pattern 240 is indicated by an alternate long and two short dashes line.

The first cell connection pattern 220 and the second cell connection pattern 240 may be alternately disposed. For example, the first cell connection pattern 220 may be disposed between adjacent second cell connection patterns 240, and the second cell connection pattern 240 may be disposed between adjacent first cell connection patterns 220.

In accordance with one or more embodiments, the first cell connection pattern 220 may electrically connect a pad PAD of the first light emitting panel 112 and a pad PAD of the second light emitting panel 114 to each other.

For example, the first cell connection pattern 220 may electrically connect a first separation pad 1240 and a second separation pad 1340 to each other. The first separation pad 1240 is a pad PAD of the first light emitting panel 112, and may be a pad disposed on a line (e.g., a row or column) which is not directly adjacent to the cutting line CL. The second separation pad 1340 is a pad PAD of the second light emitting panel 114, and may be a pad disposed on a line (e.g., a row or column) which is not directly adjacent to the cutting line CL.

In accordance with one or more embodiments, the second cell connection pattern 240 may electrically connect a pad PAD of the first light emitting panel 112 and a pad PAD of the second light emitting panel 114 to each other.

For example, the second cell connection pattern 240 may electrically connect a first adjacent pad 1220 and a second adjacent pad 1320 to each other. The first adjacent pad 1220 is a pad PAD of the first light emitting panel 112, and may be a pad disposed on a line (e.g., a row or column) which is directly adjacent to the cutting line CL. The second adjacent pad 1320 is a pad PAD of the second light emitting panel 114, and may be a pad disposed on a line (e.g., a row or column) which is directly adjacent to the cutting line CL.

The first cell connection pattern 220 may electrically connect pads PAD of the first light emitting panel 112 to each other. For example, the first separation pad 1240 may be electrically connected to another first separation pad 1240 through the first cell connection pattern 220.

The first cell connection pattern 220 may electrically connect pads PAD of the second light emitting panel 114. For example, the second separation pad 1340 may be electrically connected to another second separation pad 1340 through the first cell connection pattern 220.

The first cell connection pattern 220 and the second cell connection pattern 240 may have different sizes. For example, a length of the first cell connection pattern 220 in the first direction DR1 may be smaller than a length of the second cell connection pattern 240 in the first direction DR1.

In one or more embodiments, the length of the first cell connection pattern 220 in the first direction DR1 may correspond to a distance between pads PAD adjacent to the cutting line CL in the first direction DR1. In one or more embodiments, the length of the second cell connection pattern 240 in the first direction DR1 may correspond to a length of a pad PAD adjacent to the cutting line CL in the first direction DR1.

Each of the first cell connection pattern 220 and the second cell connection pattern 240 may include a first line extending in the generally same direction as the cutting line CL and a second line extending in a direction different from a direction in which the cutting line CL extends. Each of the first cell connection pattern 220 and the second cell connection pattern 240 includes a line extending in the first direction DR1 and a line extending in the second direction DR2.

For example, the first cell connection pattern 220 and the second cell connection pattern 240 may be bent at least twice. In one or more embodiments, each of the first cell connection pattern 220 and the second cell connection pattern 240 may include a protrusion part and a concave part, and may be electrically connected to a pad PAD of an adjacent panel through the protrusion part of each of the first cell connection pattern 220 and the second cell connection pattern 240.

Accordingly, when a cutting process on the cutting line CL is performed, electrical connection between components in the first light emitting panel 112 can be separated and electrical connection between components in the second light emitting panel 114 can be separated, while the first light emitting panel 112 and the second light emitting panel 114 are electrically separated from each other. For example, as described above, the first cell connection pattern 220 can electrically connect first separation pads PAD in the first light emitting panel 112 to each other. Because the first cell connection pattern 220 at least includes a line extending in a direction different from the direction in which the cutting line CL extends, electrical connection between components (e.g., pads PAD) in individual light emitting panels 112 or 114 can be separated when the cutting process is performed.

Next, a structure of a cell connection line 200 in accordance with one or more embodiments of the present disclosure will be described with reference to FIG. 24. In FIG. 24, descriptions of portions overlapping with those described above will be simplified or omitted, and portions different from those described above will be mainly described.

Referring to FIG. 24, the cell connection line 200 in accordance with the embodiment of the present disclosure may include a cell connection pattern 260. The cell connection line 200 may include a structure in which the same cell connection pattern 260 is provided in plurality.

The cell connection patterns 260 may be sequentially disposed along the same direction as the cutting line CL. For example, the cell connection patterns 260 may be arranged along the first direction DR1 between the first light emitting panel 112 and the second light emitting panel 114, which are adjacent to each other in the second direction DR2.

The cell connection pattern 260 may electrically connect the first adjacent pad 1220 and the second adjacent pad 1320 to each other. The cell connection pattern 260 may electrically connect the first separation pad 1240 and the second separation pad 1340 to each other.

The cell connection pattern 260 may electrically connect first separation pads 1240 in the first light emitting panel 112 to each other. The cell connection pattern 260 may electrically connect second separation patterns 1340 in the second light emitting panel 114.

Each of the cell connection patterns 260 may include a line extending in the generally same direction as the cutting line CL and a line extending in a direction different from the direction in which the cutting line CL extends. The cell connection pattern 260 may include a line extending in the first direction DR1 and a line extending in the second direction DR2.

In accordance with this embodiment, like the above-described embodiment, electrical connection between components in individual light emitting panels 112 or 114 can be separated while adjacent light emitting panels 112 and 114 are electrically separated from each other through a single process. In addition, a single pattern is repeatedly disposed, so that process performance can be improved.

In accordance with one or more embodiments, a distance between lines of the cell connection pattern 260 may be constant. The distance between lines is sufficiently secured, so that a short-circuit defect between lines may be reduced or prevented.

Next, a structure of a cell connection line 200 in accordance with an embodiment of the present disclosure will be described with reference to FIG. 25. In FIG. 25, descriptions of portions overlapping with those described above will be simplified or omitted, and portions different from those described above will be mainly described.

Referring to FIG. 25, the cell connection line 200 in accordance with the embodiment of the present disclosure may include a symmetric cell connection pattern 280. The cell connection line 200 may include a structure in which a plurality of symmetric cell connection patterns 280 are arranged.

The symmetric cell connection pattern 280 may be symmetrical in one direction. The symmetric cell connection pattern 280 may be symmetrical with respect to a direction different from the direction in which the cutting line CL extends. For example, when the symmetric cell connection patterns 280 are arranged along the first direction DR1, the symmetric cell connection pattern 280 may be symmetrical in the second direction DR2. In accordance with one or more embodiments, the symmetric cell connection pattern 280 may include a line extending in the second direction DR2 and a plurality of lines extending in the first direction DR1 with respect to the line extending in the second direction DR2.

In accordance with one or more embodiments, the symmetric cell connection pattern 280 may electrically connect the first adjacent pad 1220 and the second adjacent pad 1320 to each other. The symmetric cell connection pattern 280 may electrically connect the first separation pad 1240 and the second separation pad 1340 to each other.

In accordance with one or more embodiments, a distance between lines of the symmetric cell connection pattern 280 may be uniform. The distance between lines is sufficiently secured, so that a short-circuit defect between lines can be prevented.

The symmetric cell connection pattern 280 may include a first symmetric connection pattern 282 and a second symmetric connection pattern 284. In accordance with one or more embodiments, the first symmetric connection pattern 282 and the second symmetric connection pattern 284 may be different from each other. For example, the first symmetric connection pattern 282 and the second symmetric connection pattern 284 may have shapes reversed to each other in the second direction DR2. However, the present disclosure is not necessarily to the above-described example. For example, the cell connection line 200 may have a structure in which symmetric cell connection patterns 280 equal to one another are sequentially arranged.

In accordance with this embodiment, like the above-described embodiment, electrical connection between components in individual light emitting panels 112 or 114 can be separated while adjacent light emitting panels 112 and 114 are electrically separated from each other through a single process.

In accordance with one or more embodiments, after light emitting panels 112 and 114 are individually separated from each other along the cutting line CL, a number of lines remaining in any one of the light emitting panels 112 and 114 may be greater than a number of pads PAD to be connected. For example, referring to FIG. 25, when the first light emitting panel 112 is separated along the cutting line CL, a number of cell connection lines 200 physically separated from each other may be 9, and a number of pads PAD to be connected may be 7.

Referring to FIG. 26, cell areas CA may be separated from each other, so that individually provided light emitting panels 110 are provided. As described above, light emitting elements LD can be aligned between the first electrode ELT1 and the second electrode ELT1, and influence caused by static electricity in the light emitting panel 110 when a process is performed can be reduced. Accordingly, the light emitting elements LD can be normally operated, and the light emission efficiency of the display device DD can be improved.

In accordance with the present disclosure, there can be provided a manufacturing method for a display device, a panel for manufacturing a display device, and a display device, in which static electricity occurring in the display device is prevented (or reduced), so that structural damage can be prevented or reduced and light emission efficiency can be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method for manufacturing a display device, the method comprising:
    placing a light emitting element on a substrate including cell areas;
    placing an insulating layer on the light emitting element; and
    separating the cell areas from each other,
    wherein light emitting panels are located on the substrate correspond to each of the cell areas, and comprise the light emitting element,
    wherein the separating of the cell areas from each other comprises electrically separating the light emitting panels from each other,
    wherein the electrically separating the light emitting panels from each other is performed after the placing of the insulating layer,
    wherein the light emitting panels comprises a first light emitting panel and a second light emitting panel,
    wherein the method further comprises placing a cell connection line electrically connecting the first light emitting panel and the second light emitting panel to each other,
    wherein the cell connection line has a structure in which a first cell connection pattern and a second cell connection pattern are sequentially arranged along an one direction, and wherein the first cell connection pattern electrically connects first adjacent pads of the first light emitting panel and second adjacent pads of the second light emitting panel to each other.

2. The method of claim 1, further comprising placing, on the substrate, an alignment electrode comprising first electrodes, second electrodes, a first alignment line, and a second alignment line.

3. The method of claim 2, wherein the placing of the light emitting element comprises arranging the light emitting element, based on an electric field between the first electrodes and the second electrodes.

4. The method of claim 2,
    wherein the first light emitting panel and the second light emitting panel are distinguished from each other with respect to a cutting line extending in the one direction.

5. The method of claim 4, wherein the display device comprises a plurality of sub-pixels,
    wherein, before the light emitting element is placed, the first electrodes are commonly connected to the first alignment line, and the second electrodes are commonly connected to the second alignment line,
    wherein the method further comprises removing a portion of the alignment electrode, and
    wherein the removing of the portion of the alignment electrode comprises removing a portion of the first electrodes such that the plurality of sub-pixels are individually driven without removing at least a portion of the cell connection line.

6. The method of claim 4, wherein during the placing of the insulating layer, a portion of the cell connection line is electrically connected to the first alignment line, and another portion of the cell connection line is electrically connected to the second alignment line.

7. The method of claim 4, further comprising removing a portion of the alignment electrode,
    wherein an anode signal is supplied to the first alignment line, and a cathode signal is supplied to the second alignment line, and
    wherein the removing of the portion of the alignment electrode comprises cutting off the cell connection line electrically connected to the first alignment line without removing a portion of the cell connection line electrically connected to the second alignment line.

8. The method of claim 4, further comprising forming a first contact electrode electrically connecting the light emitting element and the first electrodes to each other and a second contact electrode electrically connecting the light emitting element and the second electrodes to each other,
    wherein the insulating layer is located on the first contact electrode and the second contact electrode.

9. The method of claim 4, further comprising separating the cell areas from each other,
    wherein the separating of the cell areas from each other comprises:
        cutting off the substrate along the cutting line; and
        separating electrical connection between the first light emitting panel and the second light emitting panel.

10. The method of claim 9, wherein the cutting off of the substrate and the separating of the electrical connection between the first light emitting panel and the second light emitting panel are performed through a same process.

11. The method of claim 10, wherein the separating of the cell areas from each other is performed by using a scribing process.

12. The method of claim 9, wherein the separating of the electrical connection between the first light emitting panel and the second light emitting panel is performed after the placing of the insulating layer.

13. The method of claim 4, wherein the cell connection line comprises a first line extending in a same direction as the cutting line and a second line extending in a direction different from the one direction in which the cutting line extends.

14. The method of claim 13, wherein the second cell connection pattern electrically connects first separation pads of the first light emitting panel and second separation pads of the second light emitting panel to each other, wherein the first cell connection pattern electrically connects the first separation pads of the first light emitting panel to each other, and wherein the second cell connection pattern electrically connects the second separation pads of the second light emitting panel to each other.

15. The method of claim 13, wherein the cell connection line has a structure in which a same cell connection patterns are arranged.

16. The method of claim 13, wherein the cell connection line has a structure in which symmetric cell connection patterns are arranged, and wherein the symmetric cell connection pattern is symmetrical with respect to a direction different from the direction in which the cutting line extends.

17. The method of claim 1, wherein the insulating layer is formed after the light emitting element is located.

18. The display device manufactured according to the method of claim 1.

19. A method for manufacturing a display device, the method comprising:

placing a light emitting element on a substrate including a first cell area and a second cell area;

placing a cell connection line electrically connecting a first light emitting panel corresponding to the first cell area and a second light emitting panel corresponding to the second cell area to each other; and separating the first cell area and the second cell area from each other, wherein the separating of the first cell area and the second cell area from each other comprises:

cutting off the substrate such that the first light emitting panel and the second light emitting panel are separated from each other; and cutting off the cell connection line such that the first light emitting panel and the second light emitting panel are electrically separated from each other, wherein the cell connection line has a structure in which a first cell connection pattern and a second cell connection pattern are sequentially arranged along an one direction, and wherein the first cell connection pattern electrically connects first adjacent pads of the first light emitting panel and second adjacent pads of the second light emitting panel to each other.

* * * * *